United States Patent
Nomura et al.

(10) Patent No.: US 6,941,485 B2
(45) Date of Patent: Sep. 6, 2005

(54) CLOCK SUPPLY CIRCUIT FOR SUPPLYING A PROCESSING CLOCK SIGNAL USED FOR PROCESSING AN INPUT SIGNAL HAVING A PREDETERMINED FREQUENCY

(75) Inventors: Kiyoshi Nomura, Kanagawa (JP); Tadashi Fukami, Kanagawa (JP); Masaru Goto, Saitama (JP); Takayoshi Koizumi, Saitama (JP)

(73) Assignee: Sony Corporation (JP)

( * ) Notice: Subject to any disclaimer, the term of this patent is extended or adjusted under 35 U.S.C. 154(b) by 874 days.

(21) Appl. No.: 09/911,822

(22) Filed: Jul. 25, 2001

(65) Prior Publication Data

US 2002/0023239 A1 Feb. 21, 2002

(30) Foreign Application Priority Data

Jul. 26, 2000 (JP) .................................... P2000-224915
Jul. 28, 2000 (JP) .................................... P2000-229512
Jun. 8, 2001 (JP) .................................... P2001-174355

(51) Int. Cl.$^7$ ................................................ G06F 1/04
(52) U.S. Cl. ...................................... 713/501; 713/500
(58) Field of Search ............................... 713/500, 501, 713/320, 322, 323; 375/130, 136, 138

(56) References Cited

U.S. PATENT DOCUMENTS

| | | | | |
|---|---|---|---|---|
| 5,774,704 A | * | 6/1998 | Williams ..................... | 713/501 |
| 6,078,225 A | * | 6/2000 | Bontekoe et al. ............. | 331/14 |
| 6,188,258 B1 | * | 2/2001 | Nakatani .................... | 327/157 |
| 6,519,706 B1 | * | 2/2003 | Ogoro ........................ | 713/322 |
| 6,529,548 B1 | * | 3/2003 | Aoki et al. .................. | 375/224 |
| 6,654,406 B1 | * | 11/2003 | Kim et al. .................. | 375/137 |
| 6,721,892 B1 | * | 4/2004 | Osborn et al. ............. | 713/300 |
| 6,728,926 B1 | * | 4/2004 | Kakemizu et al. .......... | 714/789 |

\* cited by examiner

*Primary Examiner*—Rehana Perveen
*Assistant Examiner*—Paul Yanhus, III
(74) *Attorney, Agent, or Firm*—Rader, Fishman & Grauer, PLLC; Ronald P. Kananen

(57) ABSTRACT

A clock supply circuit capable of supplying clock signals having different frequencies to processing circuits, simplifying the circuit configuration, and realizing a reduction of the power consumption only by using a low frequency external oscillator, wherein a reference clock is multiplied by a multiplication circuit to generate a multiplied clock, the multiplied clock is divided by a predetermined division ratio to generate a clock signal having a desired constant frequency by a receiving clock generating circuit, furthermore, a DSP clock generating circuit generates a clock signal having a variable frequency according to a processing load of a DSP in accordance with a judgment result of a load judgment circuit, so it is possible to supply a clock signal maintained synchronization with received signal as well as a clock signal having a frequency variably controlled in accordance with the processing load.

9 Claims, 20 Drawing Sheets

 FIG.4A RCK(24.576MHz)
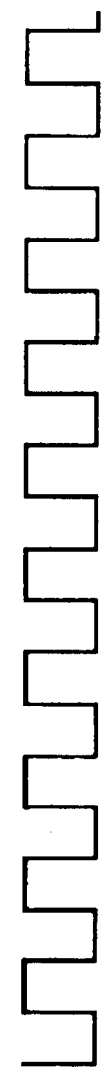 FIG.4B CLK(98.304MHz)
 FIG.4C CK1 (24.576MHz) (FREQUENCY DIVISION RATIO N=4)
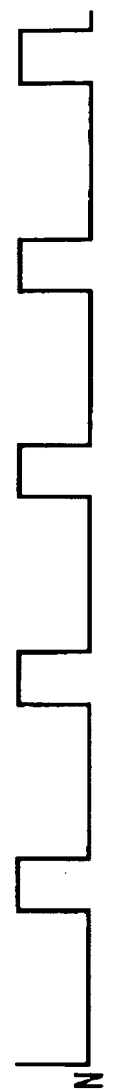 FIG.4D CK2 (49.152MHz) (FREQUENCY DIVISION RATIO N=2)
 FIG.4E CK2 (24.576MHz) (FREQUENCY DIVISION RATIO N=4)
 FIG.4F CK2 (12.288MHz) (FREQUENCY DIVISION RATIO N=8)

CLOCK SUPPLY CIRCUIT FOR SUPPLYING A PROCESSING CLOCK SIGNAL USED FOR PROCESSING AN INPUT SIGNAL HAVING A PREDETERMINED FREQUENCY

BACKGROUND OF THE INVENTION

1. Field of the Invention

The present invention relates to a clock supply circuit in a receiving LSI of digital broadcasting for supplying a clock signal, for example, to a processing circuit such as a receiving circuit and a DSP, more particularly relates to a clock supply circuit for supplying a clock signal whose frequency is switched in accordance with an amount out-of-sync to maintain synchronization with transmission signals, also for supplying a clock signal whose frequency is controlled in accordance with a processing load of the processing circuit, etc.

2. Description of the Related Art

A receiver of digital audio broadcasting (DAB) receives a broadcast signal having a certain cycle transmitted from a broadcast station and demodulates and decodes the signal in accordance with the received signal to reproduce an audio signal. Therefore, it is necessary to maintain synchronization of the local clock signal supplied to the receive circuit with respect to the broadcast signal to retrieve the broadcast signal correctly. That is, to provide a clock signal of a certain frequency same as that of the broadcast signal, for example, 24 MHZ, to the receive circuit. Therefore, in a conventional receiver, for example, a voltage-controlled oscillator is used for generating the local clock signal in a clock generating circuit wherein the synchronization of the local clock signal with the broadcast signal is maintained by detecting an amount of offset with respect to the broadcast signal (amount out-of-sync) on a time axis, and controlling the oscillating frequency of the oscillator.

Also, it is desirable that a clock signal of a variable frequency controlled in frequency in accordance with a processing load is supplied to a processing circuit for processing the received signal, for example, a processing circuit which includes a DSP circuit and expands an MPEG stream. This is because the processing ability of the DSP is determined in accordance with the frequency of the supplied clock signal. The higher the clock frequency, the higher the processing ability of the DSP, and the more information which can be processed per unit time.

In the case of digital audio broadcasting, the broadcast signal differs in accordance with the broadcast signal standard. For example, the number of data points differs in each symbol in an OFDM modulated signal in accordance with a broadcast mode. Therefore, on the receiving side, the processing load of an MPEG decoding circuit for expanding an MPEG stream demodulated according to the OFDM scheme changes in accordance with the broadcast mode.

In the past, as a means to solve this problem, in a receiving circuit, a plurality of DSPs were arranged and the processing load was distributed among a plurality of processing circuits so as to reduce loads of each processing circuit.

In the above conventional method, however, a plurality of the same blocks are provided, so the circuit size is increased, which leads to an increase of electric power consumption and waste.

Thus, as another means of solution, an external oscillator is made to generate a high frequency clock and that high frequency clock signal is divided inside the LSI so as to supply a high frequency clock signal of a variable frequency to the DPS and other processing blocks in addition to a reference clock signal of a constant frequency. However, when the frequency of the external clock signal becomes higher, the power consumption becomes larger by that amount. Therefore, in the past, this was dealt with stopping the supply of the clock signal to the DSP after the end of processing of the DSP, that is, by a so-called sleep mode. As a result, there is the disadvantage that control becomes complicated due to switching of the operation mode of the DSP and sufficient effects cannot be obtained.

Also, in the receive circuit, a method for generating a local clock signal was taken which maintained synchronization with the broadcast signal by using a voltage-controlled oscillator and controlling the oscillation frequency in accordance with the amount of the offset on the time axis. Since the voltage-controlled oscillator used was an expensive one such as a VCXO (voltage-controlled crystal oscillator), it led to an increase of the cost. Further, since feedback control was performed to generate a control signal in accordance with the offset and output the same to the VCXO, there was a disadvantage that the circuit configuration became complicated and the circuit scale became large.

SUMMARY OF THE INVENTION

An object of the present invention is to provide a clock supply circuit capable of supplying clock signals having frequencies in accordance with the processing load of the signal processing circuit, also supplying clock signals of different frequencies to the receive circuit of the broadcast signal by generating divided clock signals with dividing a high frequency clock signal with different division ratios and switching the divided clock signals in accordance with the out-of-sync with respect to the broadcast signal so as to compensate the out-of-sync, simplifying the circuit configuration, and realizing a reduction of power consumption.

To achieve the above object, according to the present invention, there is provided a clock supply circuit comprising a first clock generating circuit for supplying a first clock signal having an almost fixed frequency to a first processing circuit, a load judgment means for judging a processing load of a second processing circuit, and a second clock generating circuit for variably controlling a frequency of a second clock signal in accordance with a judgment result of the load judgment means and supplying the second clock signal to a second processing circuit.

Also, in the present invention, preferably, the first processing circuit includes a demodulation processing circuit for demodulating a received signal having a predetermined frequency transmitted through a channel, and generating a bit stream signal, the second processing circuit includes a decoding processing circuit for decoding the demodulated bit stream signal output from the demodulation processing circuit.

Also, in the present invention, preferably, further comprising a multiplication circuit generating a multiplied clock signal obtained by multiplying a reference clock signal having a predetermined frequency supplied from outside by a predetermined multiplication factor, wherein the first clock generating circuit includes a first frequency division circuit for dividing the multiplied clock signal by a first frequency division ratio and supplying the divided clock signal as the first clock signal, the second clock generating circuit includes a second frequency division circuit for dividing the multiplied clock signal by a second frequency division ratio controlled in accordance with a judgment result of the load judgment means and supplying the divided clock signal as the second clock signal.

Also, in the present invention, preferably, the first processing circuit processing the received signal using the first clock signal, further comprises a timing compensation means for detecting a timing deviation between the first clock signal and the received signal and compensating the timing of the first clock signal in accordance with the detection result.

Further, according to the present invention, there is provided a clock supply circuit for supplying a processing clock signal for processing an input signal having a predetermined frequency, the clock supply circuit comprising a clock generating means generating a intermediate clock signal for processing the input signal, a first clock signal higher in frequency than the intermediate clock signal, and a second clock signal lower in frequency than the intermediate clock signal, a clock switching means selecting any of the intermediate clock signal, the first clock signal or the second clock signal, supplying the selected one as the processing clock signal to the signal processing, and a clock switching control means for processing the input signal with use of the selected processing clock signal, detecting an amount out-of-sync of the processing clock signal with respect to the input signal in accordance with the processing result, and controlling the clock switching in accordance with the detected amount out-of-sync.

Also, in the present invention, preferably, the clock generating means further comprises an oscillation means generating a reference clock signal having a predetermined reference frequency, a multiplying means generating a multiplied clock signal obtained by multiplying the reference clock signal, and a frequency division means for dividing the multiplied clock signal by different frequency division ratios to generate the intermediate clock signal, the first clock signal and the second clock signal, respectively.

Also, in the present invention, preferably, the clock switching means switches the clock signals using a predetermined time span as a switching time unit wherein at the start and ending time phases of the intermediate clock signal, the first and second clock signals match.

Also, in the present invention, preferably, comprises a counter for counting the multiplied clock signal, having a maximum count value set in accordance with a least common multiple of an intermediate division ratio for generating the intermediate clock signal, a first division ratio for generating the first clock signal and a second division ratio for generating the second clock signal, wherein the clock switching means performs clock switching when the count value of the counter reaches a predetermined value.

Also, in the present invention, preferably, the predetermined value is zero or the maximum count value.

Also, in the present invention, preferably, the clock switching means switches the intermediate clock signal and the first clock signal using a predetermined time span as a first time switching unit wherein at the start and ending time phases of the intermediate clock signal and the first clock signal match, and switches the intermediate clock signal and the second clock signal using a predetermined time span as a second time switching unit wherein at the start and ending time phases of the intermediate clock signal and the second clock signal match.

Also, in the present invention, preferably, further comprises a first counter counting the multiplied clock signal, having a first maximum count value set in accordance with a least common multiple of an intermediate division ratio for generating the intermediate clock signal and a first division ratio for generating the first clock signal, and a second counter counting the multiplied clock signal, having a second maximum count value set in accordance with a least common multiple of a intermediate division ratio for generating the intermediate clock signal and a second division ratio for generating the second clock signal, wherein the clock switching means further comprises a first switching circuit performing clock switching of the intermediate clock signal and the first clock signal when the count value of the first counter reaches a first value, and a second switching circuit performing clock switching of the intermediate clock signal and the second clock signal when the count value of the second counter reaches a second value.

Also, in the present invention, preferably, the first value is zero or the first maximum value, and the second value is zero or the second maximum value.

Further, according to the present invention, there is provided a clock supply circuit supplying a processing clock signal for processing an input signal having a predetermined frequency, the clock supply circuit comprising a clock generating means generating a first clock signal and a second clock signal having a lower frequency than that of the first clock signal, a clock switching means selecting any of the first clock signal or the second clock signal, supplying the selected one as the processing clock signal to the signal processing, and a clock switching control means for processing the input signal with use of the selected processing clock signal, detecting an amount out-of-sync of the processing clock signal with respect to the input signal in accordance with the processing result, and controlling the clock switching in accordance with the detected amount out-of-sync.

Also, in the present invention, preferably, the clock generating means further comprises an oscillation means generating a reference clock signal having a predetermined reference frequency, a multiplying means generating a multiplied clock signal obtained by multiplying the reference clock signal, and a frequency division means for dividing the multiplied clock signal by different frequency division ratios to generate the first clock signal and the second clock signal, respectively.

Also, in the present invention, preferably, the clock switching means switches the clock signals using a predetermined time span as a switching time unit wherein at the start and ending time phases of the first and second clock signals match.

Also, in the present invention, preferably, further comprises a counter for counting the multiplied clock signal, having a maximum count value set in accordance with a least common multiple of a first division ratio for generating the first clock signal and a second division ratio for generating the second clock signal, wherein the clock switching means performs clock switching when the count value of the counter reaches a predetermined value.

Also, in the present invention, preferably, the predetermined value is zero or the maximum count value.

BRIEF DESCRIPTION OF THE DRAWINGS

These and other objects and features of the present invention will become clearer from the following description of the preferred embodiments given with reference to the accompanying drawings, in which:

FIGS. 4A to 4F are views of waveforms of a receiving clock signal CK1 and the DSP clock signal CK2 generated by the clock supply circuit according to the first embodiment;

FIGS. 20A to 20E are waveform diagrams showing clock switching operation of the fourth embodiment.

DESCRIPTION OF THE PREFERRED EMBODIMENTS

Below, preferred embodiments will be described with reference to the accompanying drawings.

A clock supply circuit of the present invention is, for example, provided inside a receiver signal processing LSI for digital audio broadcasting (DAB) and supplies a clock signal to the blocks in the signal processing LSI.

Figure 1:
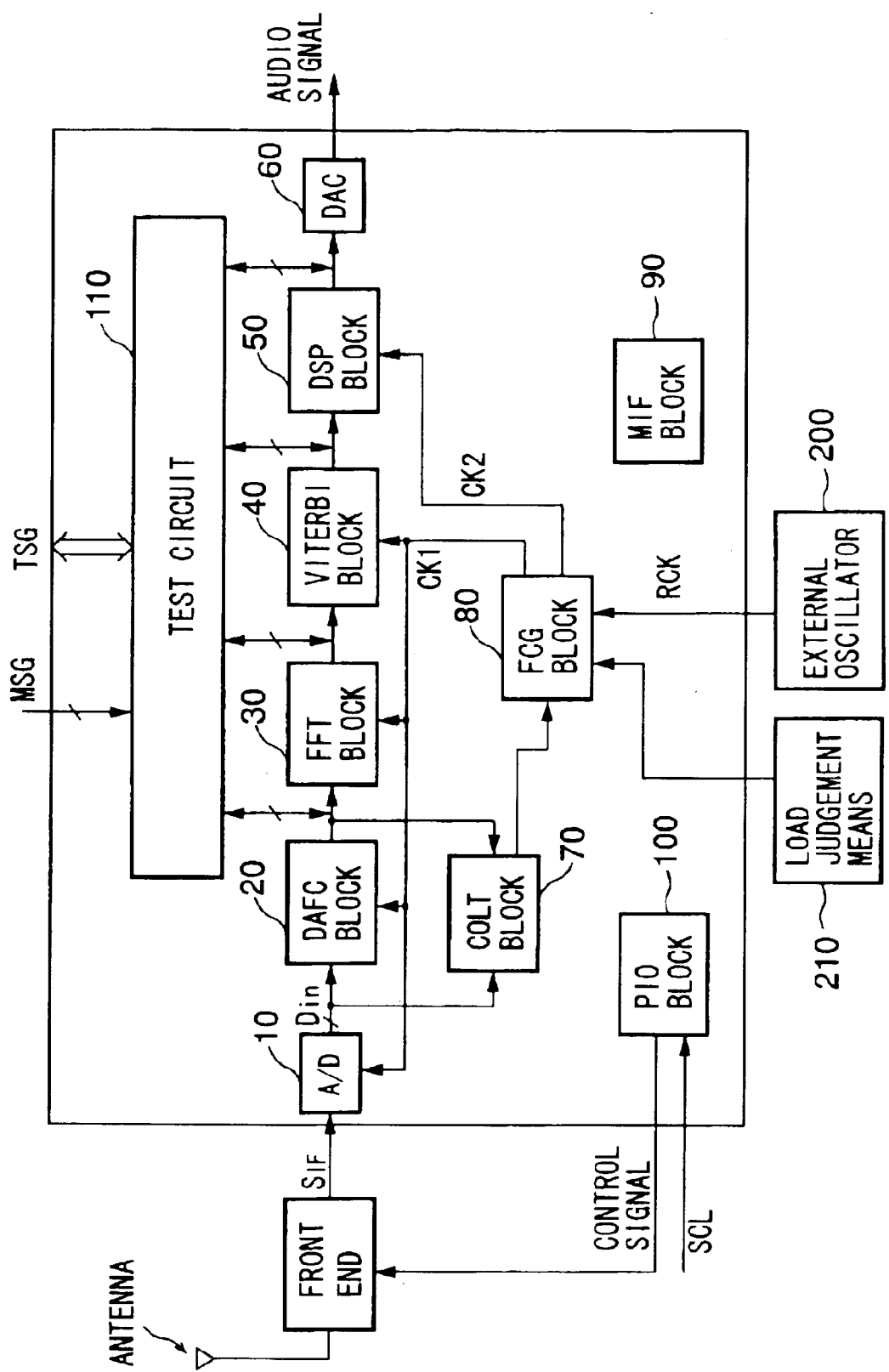
FIG. 1 is a block diagram of an LSI for receiving digital broadcasting comprising a clock supply circuit according to the present invention.

FIG. 1 is a block diagram of the overall configuration of a signal processing LSI including a clock supply circuit according to the present invention.

As shown in the figure, the LSI of the present example comprises an analog/digital converter (A/D) 10, a DAFC block 20, an FFT block 30, a Viterbi decoding block 40, a DSP block 50, a digital/analog converter (DAC) 60, a COLT block 70, an FCG block 80, an MIF block 90, a PIO block 100, and a test circuit 110. Additionally, an external oscillator 200 generating a reference clock signal RCK having a predetermined frequency and a load judgment circuit 210 judging a processing load of the DSP block 50 are provided outside the LSI.

The FCG block 80 is a clock supply circuit according to the present invention. As shown in the figure, the FCG block 80 supplies a clock signal CK1 to the DAFC block 20, FFT block 30, and Viterbi decoding block 40, and, furthermore, supplies a clock signal CK2 to the DSP block in accordance with the reference clock signal RCK supplied by the external oscillator 200. Preferably, the clock signal CK1 is completely synchronized with the received DAB broadcast signal, and the clock signal CK2 is controlled variably in frequency according to the processing load of the DSP block 50.

In digital audio broadcasting, audio information is compressed based on the MPEG audio standard. the compressed MPEG bit stream is coded by convolution coding and time interleaved, then modulated by OFDM modulation and transmitted by a radio wave. Note that to suppress a multi-path effect in a transmission path of the radio wave, the broadcasting side provides the OFDM modulated wave with a guard interval for every symbol on the time axis, so an OFDM modulated signal comprised of the transmission symbols comprising the guard intervals and effective symbols is actually broadcast.

The receiving side receives the digital broadcast signal by a receiving antenna and restores the audio signal from the received signal. For example, as shown in FIG. 1, it receives the input of the received signal at its front end, converts the frequency of the received signal and amplifies the signal at the front end, then outputs an intermediate frequency signal $S_{IF}$. The LSI shown in FIG. 1 has a plurality of functions of digitizing the intermediate frequency signal $S_{IF}$, restoring the audio data by Fourier conversion, Viterbi decoding, and other signal processing, and converting on the audio data obtained by MPEG decoding from a digital to analog format to reproduce the audio signal.

Below, the functions of the blocks will be explained.

The A/D converter 10 converts the analog signal $S_{IF}$ input from the front end to a digital signal and outputs the converted data $D_{in}$ to the DAFC block 20 and the COLT block 70.

The DAFC block 20 is comprised of three circuits, that is, a DIQ (orthogonal demultiplexing) filter, adjacent channel disturbance removing filter, and frequency offset correction circuit. The DIQ filter separates orthogonal I-components and Q-components in data sampled by the A/D converter 10. The adjacent channel disturbance removing filter removes signal components other than the frequency band range occupied by the DAB broadcast signal. The frequency offset correction circuit performs processing using a predetermined algorithm to make the frequency offset of not more than a carrier unit calculated by the DSP block 50 zero.

The FFT block 30 performs FFT processing for demodulating the received OFDM symbols. Note that since the length of time and the number of points of data of one symbol are different depending on the mode of the broadcast signal, the FFT block 30 determines the number of points of FFT conversion in accordance with mode information etc. obtained in advance. The I-data and Q-data obtained by the FFT conversion are output to the Viterbi decoding block 40.

The Viterbi decoding block 40 performs frequency deinterleaving, time deinterleaving, Viterbi decoding, etc. on the I-data and Q-data transmitted from the FFT block 30, generates a DAB signal in frame units, and outputs the same to the DSP block 50.

The DSP block 50 decodes the frame units of the audio signal output from the Viterbi decoding block 40 by the MPEG audio signal decoding system to generate PCM (pulse code modulation) data. The DAB signal obtained by the FFT block 30 and the Viterbi decoding block 40 is an MPEG stream compressed and coded based on the MPEG audio decoding system. Therefore, the DSP block 50 performs MPEG audio decoding on the received MPEG stream to expand the compressed audio signal and restore the PCM data of the audio signal.

The D/A converter (DAC) 60 converts the PCM data restored by the DSP 50 to an analog signal and outputs the audio signal.

The COLT block 70 is comprised of a symbol data acquisition circuit, a time base circuit, and a correlation processing circuit.

The symbol data acquisition circuit acquires symbol data based on the IQ data output from the DAFC block 20.

The time base circuit is provided with a local time counter. Using the time counter, it supplies a basic interruption signal at certain time intervals to the DSP block 50 and further supplies a frame synchronization signal for notifying the head of a frame to the FFT block 30.

The correlation processing circuit calculates correlation values of data of guard bands with effective symbols in the IQ data and calculates a moving average vector for the lengths of the guard bands and a scalar value thereof. Based on the scalar value of the moving average value of the guard band, a position corresponding to a null-symbol is detected. The resetting of the local time counter of the time base circuit is controlled in accordance with this.

The FCG block 80 supplies a clock signal to other blocks. For example, the FCG block 80 generates a first clock signal CK1 having a certain frequency in accordance with a reference clock RCK generated by the external oscillator 200 provided outside and supplies it to the A/D converter 10, DAFC block 20, FFT block 30, and Viterbi decoding block 40. The external oscillator 200 oscillates at a stable oscillation frequency and provides the reference clock RCK, so the first clock signal CK1 has a stable oscillation frequency.

In the present invention, since the external oscillator 200 oscillates at a stable oscillation frequency and supplies the reference clock signal RCK, the first clock signal CK1 and the second clock signal CK2 generated based on the reference clock signal RCK have stable frequencies. However, since the external oscillator 200 supplies the reference clock signal RCK at a fixed frequency, the clock signal CK1 generated by the FCG block 80 is not completely synchronized with the received broadcast signal. Therefore, an offset at the time axis appears due to the out-of-sync. In the clock supply circuit according to the present invention, by detecting an amount of the offset on the time axis due to the out-of-sync and switching among a plurality of clock signals differ in frequency generated by multiplying the reference clock signal RCK with different multiplication factors in accordance with the detection result, the out-of-sync can be compensated and synchronization with the received signal can be maintained by using the external oscillator having a fixed frequency instead of using an expensive voltage-controlled oscillator.

Also, the FCG block 80 generates a second clock signal CK2 having a frequency variable in accordance with the processing load of the DSP block 50, according to a judgment result of a load judgment circuit 210 provided outside and supplies to the DSP block 50. As a result, a clock signal CK1 having a stable frequency can be supplied by the FCG block 80 to the A/D converter 10, DAFC block 20, FFT block 30, and Viterbi decoding block 40, and a clock signal CK2 whose frequency is controlled in accordance with the processing load can be supplied to the DSP block 50.

The MIF block 90 controls input and output to and from a local bus.

The PIO block 100 serves as an interface for outputting a control signal to the front end or other external circuit and to input a control signal SCL from the front end or other external circuit to the LSI.

A test circuit 110 has two operation states: a normal mode and a test mode. As shown in FIG. 1, the test circuit 110 is controlled in operation mode in accordance with a mode control signal MSC. At the time of the test mode, the test circuit 110 selects one of the output signals from the DAFC block 20, FFT block 30, Viterbi decoding block 40, and DSP block 50 and outputs the same to the outside. Also, the test circuit 110 inputs the test signal TSG from the outside to any one of these internal blocks. At the time of a normal mode, all of input and output terminals of the test circuit 110 are kept at a fixed level or kept in a high impedance state.

Below, the configuration and operation of the clock supply circuit (that is, the FCG block 80) according to the present invention will be explained in detail with several embodiments given as examples. First, an explanation of a first embodiment of the clock supply circuit according to present invention will be given, then explanations of a second to a fourth embodiments of the clock supply circuit according to the present invention, that is, a partial circuit supplying clock signal CK1 to receive circuit in the clock supply circuit of the present invention will be given.

First Embodiment

Figure 2:
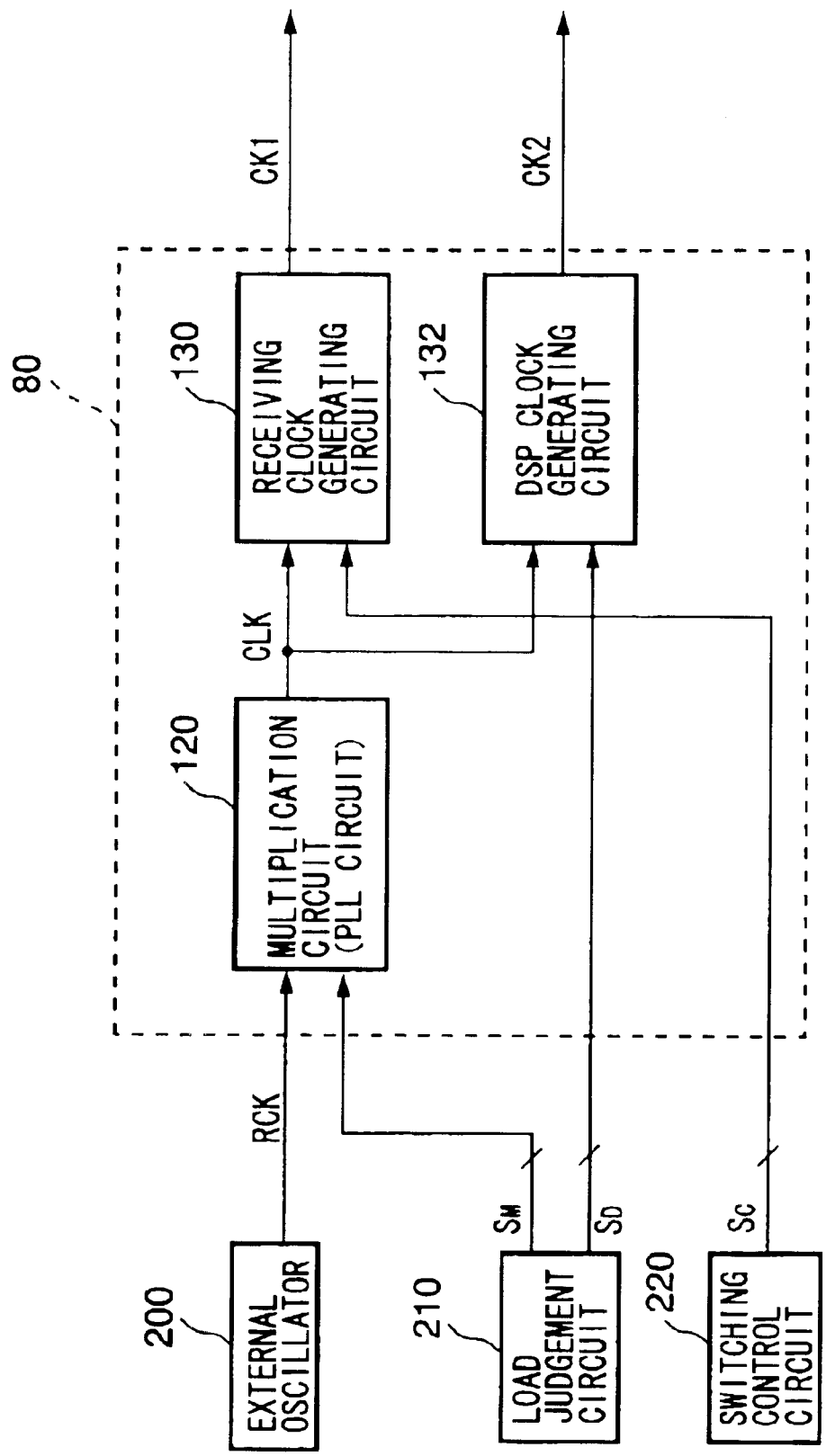
FIG. 2 is a circuit diagram of a first embodiment of a clock supply circuit according to the present invention.

FIG. 2 is a circuit diagram of a first embodiment of a clock supply circuit according to the present invention. As shown in the figure, a clock supply circuit of the present embodiment comprises a multiplication circuit (PLL circuit) 120, a receiving clock generating circuit 130 and a DSP clock generating circuit 132.

An external oscillator 200 generates a reference clock RCK and outputs the same to the multiplication circuit 120.

A load judgment circuit 210 judges a processing load of the DSP block and, in accordance with the judgment results, outputs a control signal $S_M$ for controlling a frequency multiplication factor to the multiplication circuit 120. Also, the load judgment circuit 210 generates a frequency division ratio control signal $S_D$ for controlling the frequency division ratio, outputs the same to the DSP clock generating circuit 132.

A switching control circuit 220 generates a switching control signal $S_C$ for controlling the switching of the receiving clock and outputs the same to the receiving clock generating circuit 130.

In the clock supply circuit 80 according to the present embodiment, the multiplication circuit 120, in accordance with the reference clock RCK generated by the external oscillator 200, generates a multiplied clock signal CLK obtained by multiplying the reference clock signal RCK by a multiplication factor M set in accordance with the multiplication factor control signal $S_{M'}$, outputs the same to the receiving clock generating circuit 130 and the DSP clock generating circuit 132.

The PLL circuit 120 is for example comprised of a phase comparator, a charge pump, a voltage-controlled oscillator (VCO), and a frequency divider and defines the multiplication factor M of the generated clock signal CLK in accordance with the frequency division ratio of the frequency divider.

The receiving clock generating circuit 130 generates a plurality of divided clock signals that differ in frequencies obtained by dividing the multiplied clock signal CLK by predetermined frequency division ratios, and further, selects one from the plurality of divided clock signals in accordance with the switching control signal $S_C$ from the switching control circuit 220 and outputs the selected one as the receiving clock CK1.

The DSP clock generating circuit 130 divides the clock signal CLK by a frequency division ratio set in accordance with the frequency division ratio control signal $S_D$ from the load judgment circuit 210 and supplies the divided clock signal to, for example, the DSP block 50 as the DSP clock signal CK2.

The processing load of the DSP block 50 is determined by a broadcast mode of a digital broadcast signal or contents of broadcast signal being received. For example, since a length of a symbol, a length of a guard interval, etc. are different in an OFDM modulated wave broadcast depending on the broadcast mode, the processing load differs when taking out demodulated symbol data and expanding it based on the MPEG audio compression scheme in the DSP block 50. The broadcast mode wherein a digital broadcast signal is adopted is written in the header positioned at the head of each frame of the broadcast signal.

As a result, the broadcast mode of a signal currently broadcast can be read from the received header information in the load judgment circuit 210. Then, the processing load of the DSP block can be estimated in accordance with the broadcast mode. In accordance with the estimated result, a multiplication factor control signal $S_M$ and a frequency division ratio control signal $S_D$ for controlling the frequency of the clock signal CK2 supplied to the DSP block is generated. The load judgment circuit 210 can be configured by an exclusive circuit for reading the header information of the frames of the broadcast signal. Note that normally in the DAB receiving circuit, since a control CPU for controlling operations of the front end for modulating and demodulating a radio wave signal, the receiving LSI, user interface, and other related circuits reads the header information and performs control in accordance with the same, the functions of the load judgment circuit 210 can be realized by the control CPU. In this case, it can be considered that the load judgment circuit 210 is configured by instruction codes for controlling processing of a CPU, that is, software, and a CPU for running the software.

Below, an explanation of the configuration and operation of the multiplication circuit 120 will be given with reference to FIG. 3.

Figure 3:
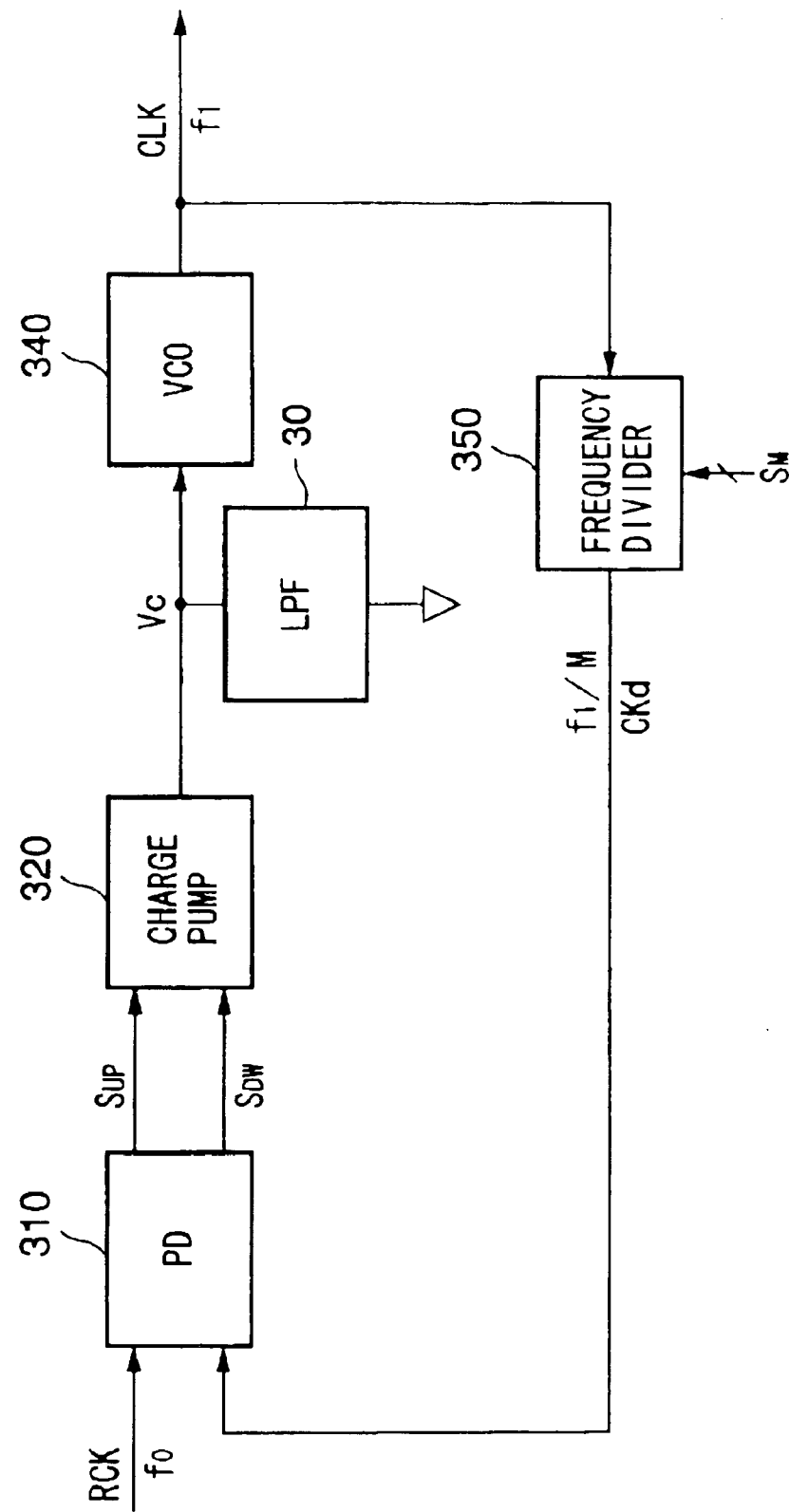
FIG. 3 is a block diagram showing a configuration of a multiplication circuit.

As shown in FIG. 3, the multiplication circuit 120 comprises a phase comparator (PD) 310, a charge pump 320, a low-pass filter (LPF) 330, a voltage-controlled oscillation circuit (VCO) 340, and a frequency divider 350.

Here, it is assumed that the frequency of the reference clock RCK input to the multiplication circuit 120 is $f_0$ and the frequency of the output clock signal CLK of the VCO 340 is $f_1$. Also, when the frequency division ratio of the frequency divider 350 is M, the frequency of the divided clock signal CKd output by the frequency divider 350 is ($f_1$/M).

The phase comparator 310 compares phases of the reference clock RCK and the divided clock signal CKd and outputs an up signal $S_{UP}$ or a down signal $S_{DW}$ in accordance with the comparison result.

Since the charge pump 320 outputs a charge current or a discharge current in accordance with the up signal $S_{UP}$ or down signal $S_{DW}$ from the phase comparator 310, a load capacity connected to an output terminal of the charge pump 320 is charged or discharged to control an output voltage Vc.

The low-pass filter 330 removes high frequency components included in the output voltage Vc of the charge pump 320 and outputs a control signal comprised of low frequency components to the VCO 340.

The VCO 340 is controlled in its oscillation frequency in accordance with the input control signal and outputs a clock signal CLK.

The frequency divider 350 divides the clock signal CLK by a frequency division ratio M and outputs the divided clock signal CKd to the phase comparator 310.

In the multiplication circuit 120 configured as above, feedback control is performed so as to match the phases of the divided clock signal CKd and the reference clock RCK. As a result, the PLL circuit is locked in a state that the frequency $f_1$/M of the divided clock signal CKd matches with the frequency $f_0$ of the reference block RCK, so the oscillation frequency of the VCO, that is, the frequency $f_1$ of the clock signal CLK, is obtained from the next equation:

$$f1 = f_0 N \quad (1)$$

Namely, when the frequency $f_0$ of the reference clock RCK supplied to the multiplication circuit 120 and the frequency division ratio M of the frequency divider 350 are determined, the frequency $f_1$ of the multiplied clock signal CLK generated by the multiplication circuit 120 is determined according to the equation (1).

The frequency division ratio M of the frequency divider 350 is controlled, for example as shown in FIG. 3, in accordance with the multiplication factor control signals $S_M$ input from the load judgment circuit 210. Since the multiplication factor control signal $S_M$ is controlled in accordance with the processing load of the DSP block, accordingly the multiplication factor of the multiplication circuit 120 is controlled, and the frequency of the multiplied clock signal CLK is controlled. For example, by assuming that the frequency $F_0$ of the reference clock RCK supplied by the external oscillator 200 is 24.576 MHZ, when the multiplication factor M of the multiplication circuit 120 is controlled at 4 in accordance with the multiplication factor control signal $S_M$, the frequency of the multiplied clock signal CLK becomes 98.034 MHZ.

At this time, for example, when the frequency division ratio of the DSP clock generating circuit 132 is controlled to 2, 4 or 8, respectively, the frequencies of the clock signal CK2 supplied to the DSP block becomes 49.152 MHZ, 24.576 MHZ, and 12.288 MHZ, respectively.

For example, when the load of the DSP block is judged to be large by the load judgment circuit 210, the division ratio of the DSP clock generating circuit 132 is set to 2 by the division ratio control signal $S_D$. Accordingly, the frequency of the clock signal CLK is controlled to 49.152 MHZ so that the DSP is driven by a high frequency clock signal CLK and a high processing load can be responded to.

On the other hand, when the load of the DSP block is judged to be small by the load judgment circuit 210, the division ratio of the DSP clock generating circuit 132 is set to 8 by the division ratio control signal $S_D$. Accordingly, the frequency of the clock signal CLK is controlled to 12.288 MHZ so that the DSP is driven by a low frequency clock signal CLK and a low processing load can be responded to, furthermore, a decrease of the power dissipation of the DSP block when the load is low can be realized by setting the frequency of the clock signal CLK lower.

FIGS. 4A to 4F show examples of waveforms of the clock signals CK1 and CK2 generated by the clock supply circuit according to the present embodiment. In this example, the frequency $f_0$ of the reference clock RCK generated by the external oscillator 200 is for example 24.576 MHZ and the multiplication factor M of the multiplication circuit 120 is for example 4. Thus, a multiplied clock signal CLK of $f_1$=98.304 MHZ is generated by the multiplication circuit 120. When the frequency division ratio N of the DSP clock generating circuit 132 is set to be for example, N=2 in accordance with the division control signal $S_D$ from the load judgment circuit 210, the frequency of the clock signal CK2 output from the DSP clock generating circuit 132 becomes 49.152 MHZ. Furthermore, when the frequency division ratio N of the DSP clock generating circuit 132 is set to be N=4 in accordance with the division control signal $S_D$ from the load judgment circuit 210, the frequency of the clock signal CK2 output from the DSP clock generating circuit 132 becomes 24.576 MHZ.

FIG. 4A shows a waveform of the reference clock RCK generated by the external oscillator 200, while FIG. 4B shows a waveform of the multiplied clock signal CLK generated by the multiplication circuit 120. Note that, in the illustrated examples, the division ratio M of the multiplication circuit 120 is for example 4. FIG. 4C shows a waveform of the receiving clock signal CK1 generated by the receiving clock generating circuit 130. Here, for example, the receiving clock signal CK1 is a divided clock signal obtained by dividing the multiplied clock signal CLK using a division ratio of for example 4.

FIG. 4D shows a waveform of the clock signal CK2 generated by the DSP clock generating circuit 132 when the division ratio N=2, FIG. 4E shows a waveform of the clock signal CK2 generated by the DSP clock generating circuit 132 when the division ratio N=4, and FIG. 4F shows a waveform of the clock signal CK2 generated by the DSP clock generating circuit 132 when the division ratio N=8.

As described above, according to the present embodiment, a reference clock RCK supplied from the external oscillator 200 is multiplied by the multiplication circuit 120 to generate a multiplied clock signal CLK. The load judgment circuit 210 judges the processing load of the signal processing circuit, for example the DSP block, the division ratio N of the DSP clock generating circuit 132 is set in accordance with the judgment result so that the clock signal CK2 having a frequency controlled in accordance with the processing load of the DSP is supplied to the DSP block. Accordingly, since the clock signal CK2 being controlled in frequency in accordance with the processing load of the DSP is supplied to the DSP block, the frequency of the clock signal CK2 can be controlled variably so that a high speed processing can be realized when the processing load is high, while a decrease of the power dissipation can be realized when the load is low.

Note that, in the clock supply circuit 80 shown in FIG. 2, the multiplication factor of the multiplication circuit 120 is controlled in accordance with the multiplication factor control signal $S_M$ supplied according to the judgment result of the load judgment circuit 210, however, the present invention is not limited to this configuration, for example, a configuration wherein the multiplication circuit 120 multiplying the reference clock signal RCK generated by the external oscillator 200 by a fixed multiplication factor so as to generate the multiplication clock signal CLK is possible, too. Proviso, by controlling the multiplication factor M of the multiplication circuit 120 and the division ratio N of the DSP clock generating circuit 132 simultaneously, the adjustable range of the frequency of the clock signal CK2 output from the DSP clock generating circuit 132 becomes wider than the case wherein only the division ratio N is controlled.

Second Embodiment

Figure 5:
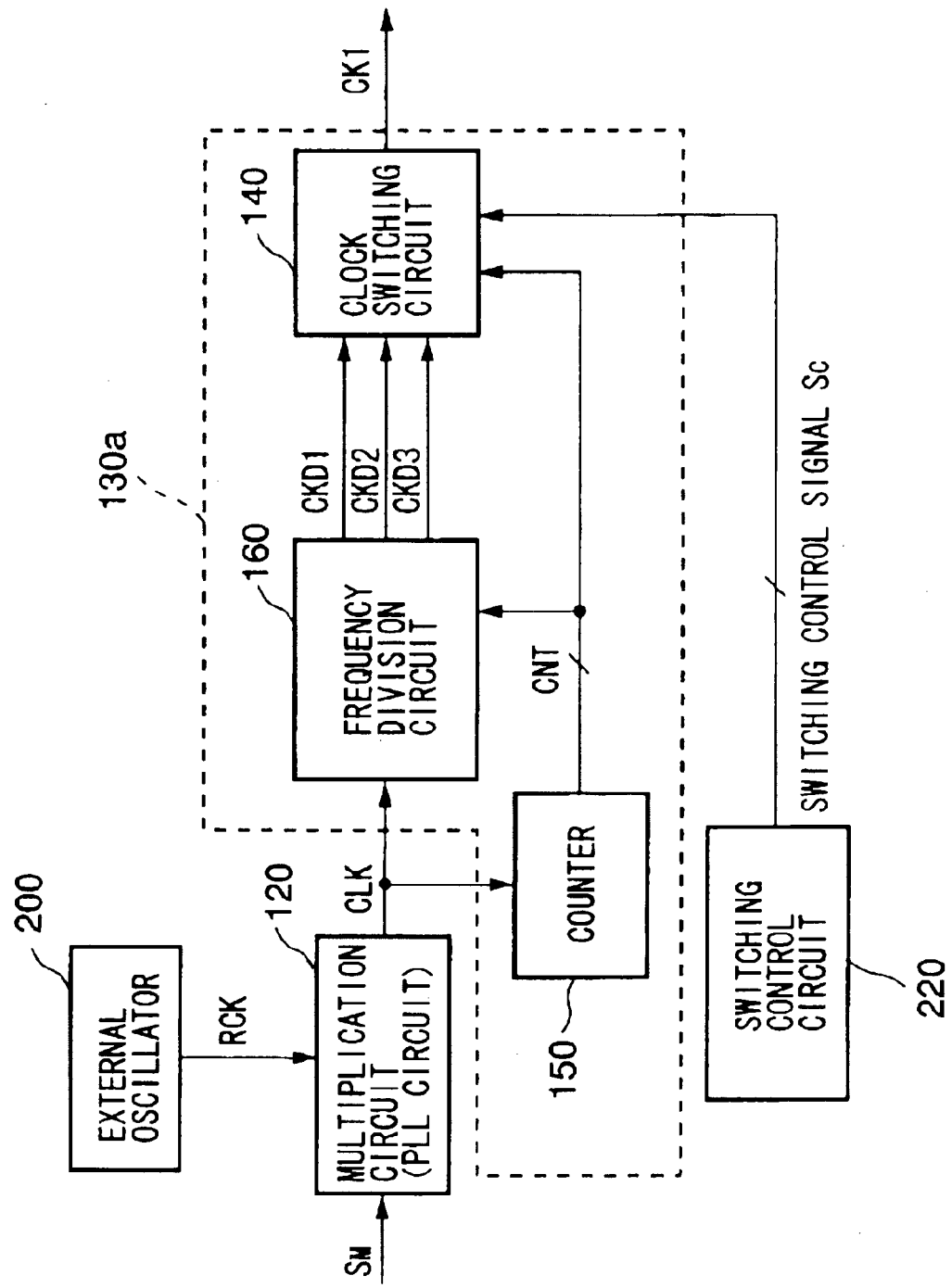
FIG. 5 is a circuit diagram of a second embodiment of a clock supply circuit according to the present invention, a diagram showing a configuration of a receiving clock generating circuit.

FIG. 5 is circuit diagram of a second embodiment of the clock supply circuit according to the present invention, particularly, a circuit diagram showing an example of a configuration of a receiving clock generating circuit supplying the receiving clock signal to the receiving circuit.

As illustrated, in the present embodiment, the receiving clock generating circuit 130a is comprised of a clock switching circuit 140, a counter 150 and a frequency division circuit 160.

The external oscillator 200 generates the reference clock signal RCK having a predetermined frequency. Note that, in the present embodiment high accuracy is not required for the external oscillator 200, a general crystal oscillator (XO) is enough.

The switching control circuit 220 is a circuit provided in for example the COLT block 70 shown in FIG. 1. The switching control circuit 220 generates a switching control signal $S_C$ in accordance with an amount of the offset on the time axis detected in the COLT block 70 and outputs the same to the clock switching circuit 140.

Below, explanations of each part of the clock supply circuit 130a of the present embodiment will be given.

The multiplication circuit 120 is comprised of a PLL circuit as described above. The multiplication circuit 120 multiplies the reference clock signal RCK input from the external oscillator 200 by a predetermined multiplication factor so as to generate a clock signal CLK having a high frequency. Here, for example, by assuming that the frequency $f_0$ of the reference clock signal RCK is 24.576 MHZ, and the multiplication factor N of the multiplication circuit 120 is 4, the frequency $f_1$ of the clock signal CLK is $f_0 \times N$=98.304 MHZ.

The frequency division circuit 160 generates a plurality of divided clock signals having different frequencies by dividing the clock signal CLK with different division ratios. Here, for example, the division circuit 160 is comprised of three dividers dividing the clock signal CLK by division ratios n1, n2 and n3 to output three divided clock signals CKD1, CKD2 and CKD3, respectively. For example, assuming that n1=3, n2=4 and n3=5, the frequencies of the divided clock signals CKD1, CKD2 and CKD3 are 32.768 MHZ, 24.576 MHZ, and 19.660 MHZ, respectively.

Figure 6:
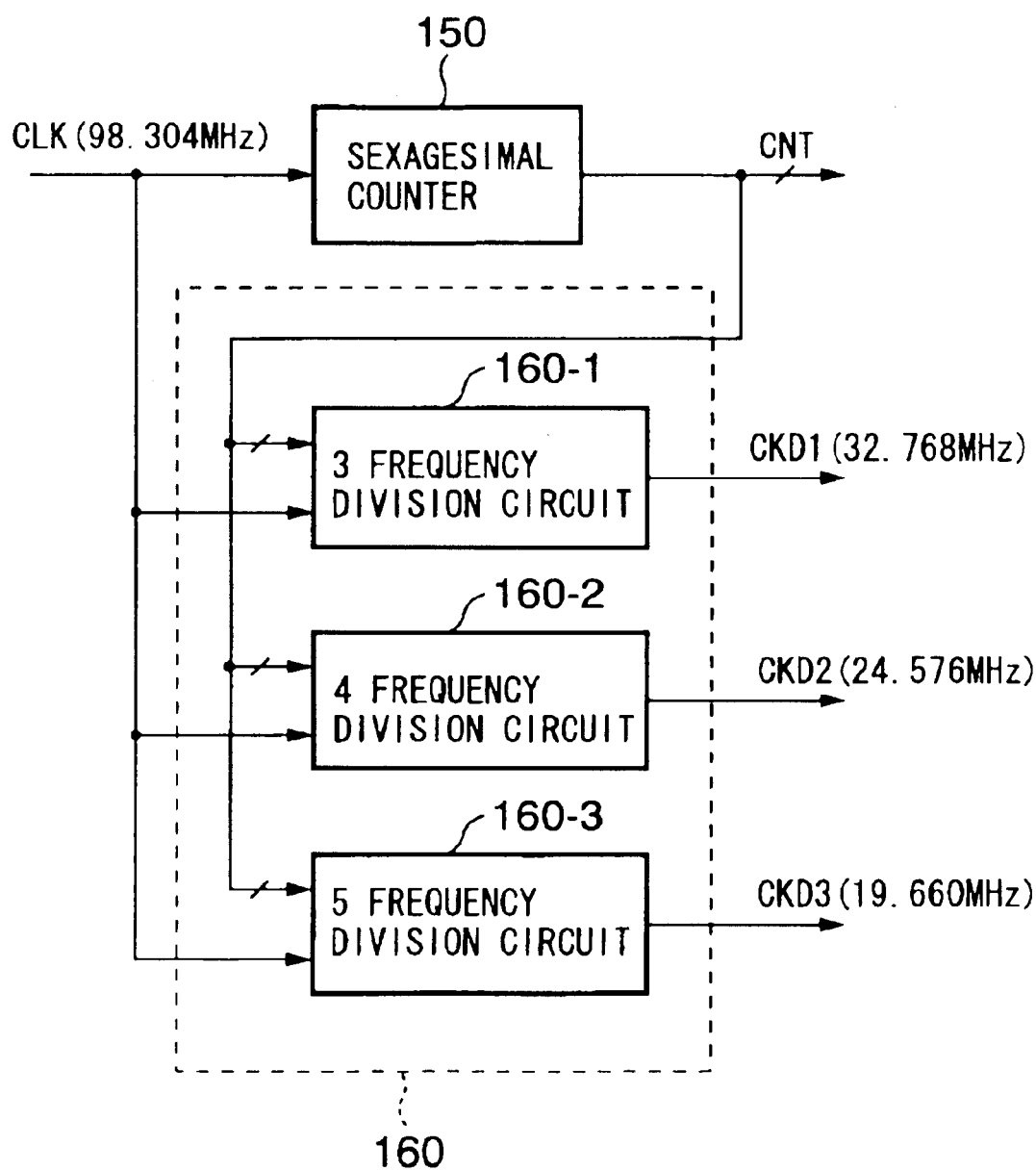
FIG. 6 is a view of a configuration of a frequency division circuit constituting the second embodiment.

FIG. 6 is a block diagram showing an example of a configuration of the division circuit 160. As illustrated, the division circuit 160 is comprised of a 3 division circuit 160-1, a 4 division circuit 160-2, and a 5 division circuit 160-3. These division circuits divide the input clock signal CLK by different division ratios to generate the divided clock signals CKD1, CKD2 and CKD3, respectively. Each division circuit comprising the division circuit 160 performs clock dividing in accordance with the count value CNT of a sexagesimal counter 150. For example, the 3 division circuit 160-1 outputs the clock signal CLK when the count value CNT becomes 0, 3, 6, . . . , the 4 division circuit 160-2 outputs the clock signal CLK when the count value becomes 0, 4, 8, . . . , and the 5 division circuit 160-3 outputs the clock signal CLK when the count value becomes 0, 5, 10, . . . . Accordingly, divided clock signals CKD1, CKD2 and CKD3 obtained by dividing the clock signal CLK with division ratios of 3, 4 and 5 are output from these division circuits.

The clock switching circuit 140 selects and outputs one of the three divided clock signals CKD1, CKD2 and CKD3 in accordance with the switching control signal $S_C$ and the count value CNT of the counter 150. As shown in FIG. 1, the clock signal CK1 selected by the clock switching circuit 140 is supplied to the DAFC block 20, FFT block 30, and Viterbi decoding block 40 of a receiving LSI. These blocks process received signals at timings set by the clock signal CK1. For example, the FFT block 30 performs FFT processing on the I-components and Q-components of the received signal and demodulates the received signal by OFDM at the timing of the clock signal CK1. Furthermore, the Viterbi decoding block 40 performs Viterbi decoding at the timing of the clock CK1. Since the clock CK1 and the received signal are not completely synchronized, an offset arises on the time axis.

The counter 150 counts the clock signal CLK output from the multiplication circuit 120, outputs the count value CNT to the clock switching circuit 140. The clock switching circuit 140 selects the divided clock signal to be switched in accordance with the switching control signal $S_C$ from the switching control circuit 220, sets a switching timing in accordance with the count value CNT. Note that, the operation of the clock switching will be explained in detail later.

Next, the method of detecting an amount of offset on the time axis will be explained.

The offset on the time axis is detected by the COLT block 70 inside the LSI. As explained above, the COLT block 70 is comprised of a symbol data acquisition circuit, a time base circuit, and a correlation processing circuit. The correlation processing circuit performs correlation processing on a synchronization symbol (TFRP symbol) and a reference symbol in the received signal to calculate an amount of offset on a frequency axis and time axis. Below, the method of calculation of the offset will be explained with reference to the configuration of a frame of a DAB broadcast signal.

Figure 7:
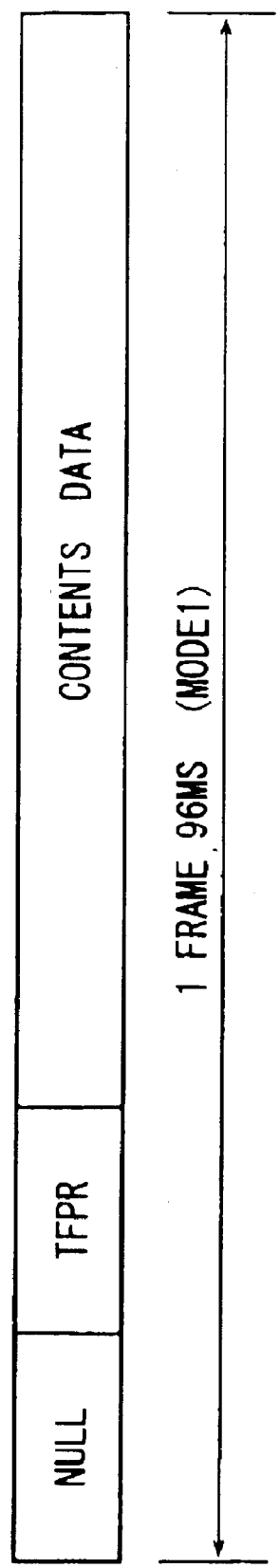
FIG. 7 is a view of the configuration of a frame of a DAB broadcast signal.

The DAB broadcast signal is transmitted in frame units. FIG. 7 is an example of the configuration of the frame of the DAB broadcast signal. As shown in the figure, a frame of the DAB broadcast signal is comprised of a null symbol (NULL) not including data, a synchronization TFPR symbol, and data symbols including information data (content data).

A null symbol is arranged at the head of each frame and normally is used for searching for the head of a frame at the receiving side.

The synchronization symbol is arranged immediately after the null symbol. The synchronization symbol is for example comprised of a string of data determined by the DAB broadcasting signal standard. The string of data has a predetermined pattern and preferably has characteristics that a sharp peak appears by correlation processing etc. The DAB receiver stores as a reference symbol a string of data having the same pattern as the synchronization symbol. When receiving a DAB broadcast signal, the COLT block 70 uses the reference symbol to detect the out-of-sync state, that is, the offset on the time axis.

Figure 8:
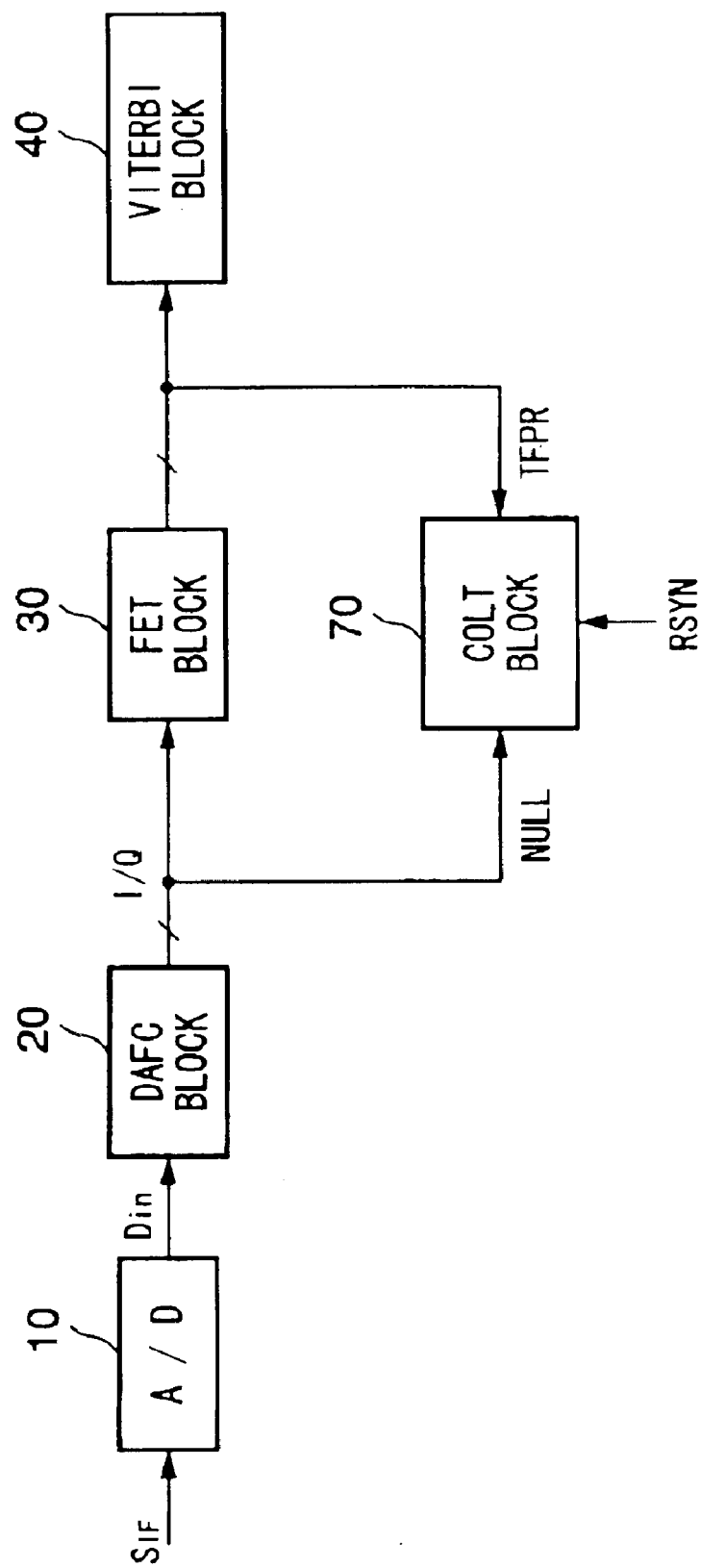
FIG. 8 is a block diagram of a partial circuit for detecting an offset on a time axis and a flow of signals.

FIG. 8 is a view of the flow of data of the null symbol and synchronization symbol in the process of detecting offset. Below, the offset detection will be explained with reference to FIG. 8.

As shown in FIG. 8, received data $D_{in}$ quantized by the A/D converter 10 is orthogonally demultiplexed by the DAFC block 20 to obtain the I-data and Q-data. The COLT block 70 first detects a null symbol to find the head of a frame in accordance with the I-data and Q-data. When detecting a null symbol, it takes out a synchronization symbol TFPR from the demodulated data (including both of the I-data and Q-data) demodulated by OFDM by the FFT block 30. Correlation processing is then performed on the synchronization symbol and the reference symbol RSYN.

As shown in FIG. 1, the DAFC block 20, FFT block 30, Viterbi decoding block 40, and COLT block 70 operate according to the clock signal CK1 supplied by the clock supply circuit (FCG block 80). Therefore, when the clock signal CK1 and the received signal are completely synchronized, the synchronization symbol TFPR output from the FFT block is correctly restored, thus a desired correlation value is obtained by the correlation processing with the reference symbol. On the other hand, when the clock signal CK and the received signal are out of sync, a value different from the desired correlation value is calculated as a result of the correlation processing with the reference symbol. Since the correlation values differ in accordance with the amount out-of-sync, that is, the offset on the time axis, the offset on the time axis can be estimated in accordance with the calculated correlation values.

The switching control circuit 210 provided in the COLT block 70 generates a switching control signal $S_C$ in accordance with the estimated offset and outputs it to the clock switching circuit 140. For example, when a processing timing of the received signal is delayed from that of the DAB broadcast signal in accordance with the detected result of the offset on the time axis, the switching control circuit 210 outputs a switching control signal $S_C$ for switching a frequency of the clock signal CK1 higher. When the processing timing of the received signal is ahead of that of the DAB broadcast signal in accordance with the detection result of the offset, the switching control circuit 210 outputs a switching control signal $S_C$ for switching a frequency of the clock signal CK1 lower. Note that when the receiving timing is synchronized with that of the DAB broadcast signal in accordance with the offset detection results, the switching control circuit 210 outputs a control signal $S_C$ for keeping the current frequency of the clock signal CK1.

That is, it is enough that the switching control signal $S_C$ is able to assign one of the three divided clock signals CKD1, CKD2 and CKD3. Therefore, for example, the switching control signal $S_C$ is comprised of two bits, by setting the relation of the 2-bit data with the assigned divided clock signal previously, the clock switching circuit 140 selects one of the divided clock signals CKD1, CKD2 and CKD3 in accordance with the 2-bit control data input and performs clock switching at the timings set in accordance with the count value CNT input from the counter 150.

Below, the operation of the clock switching circuit 140 will be explained.

As described above, the clock switching circuit 140 selects one of the three divided clock signals CKD1, CKD2 and CKD3 in accordance with the switching control signal $S_C$ and performs clock switching at the timings set by the count value CNT. Here, it is assumed that the frequencies of the clock signals CKD1, CKD2 and CKD3 are 32.768 MHZ, 24.576 MHZ, and 19.660 MHZ, respectively. For example, when a switching control signal $S_C$ for switching the clock frequency higher is received from the switching control circuit 220 while the clock switching circuit 140 is outputting the clock signal CK2, the clock switching circuit 140 selects the clock signal CK1. Conversely, when a switching control signal $S_C$ for switching the clock frequency lower is received from the switching control circuit 220 while the clock switching circuit 140 is outputting the clock signal CK2, the clock switching circuit 140 selects the clock signal CK3.

By switching at the time when phases of the clock signals to be switched are matched in the clock switching circuit 140, it is possible to prevent deviation of timing at the time of switching and breakdown of clock timing due to switching.

In the clock supply circuit of the present embodiment, the counter 150 is a sexagesimal counter, when the count value thereof is at an initial value of zero, the phases of the divided clock signals CKD1, CKD2 and CKD3 match, therefore in the clock switching circuit 140, the clock switching is performed at the time when the count value CNT of the counter 150 is at the initial value, that is, when CNT=0.

Figure 9:
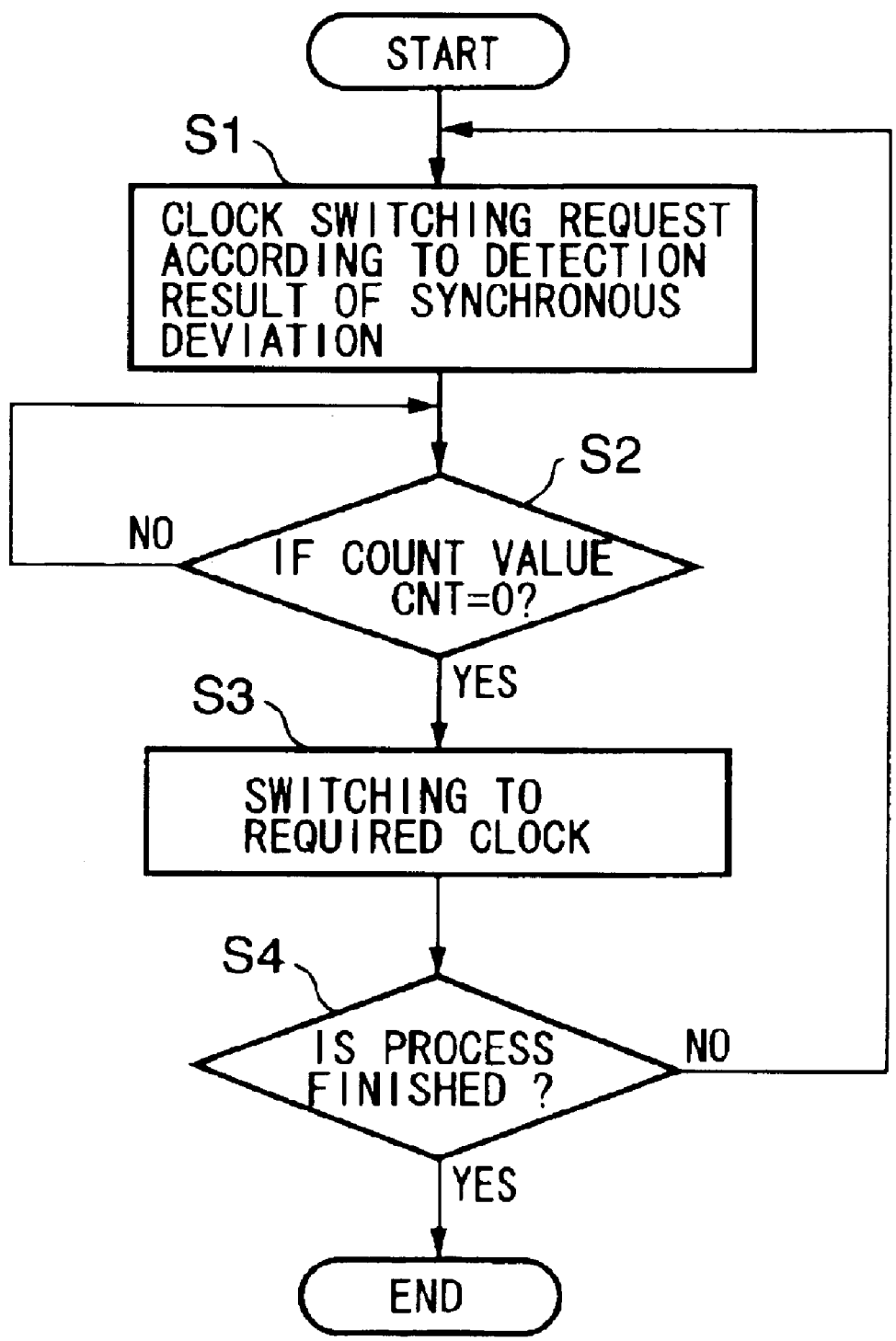
FIG. 9 is a flow chart showing clock switching operation of the second embodiment.

FIG. 9 is a flow chart showing the switching control of the clock switching circuit 140. Below, the operation of the clock switching circuit 140 will be explained with reference to FIG. 9.

First, in the step S1, a clock switching request is output from for example the switching control circuit 220 in accordance with the detection result of the out-of-sync of the clock. Note that, the detection of the out-of-sync is performed by the correlation operation in the COLT block 70 as described above. For example, while the divided clock signal CK2 having a intermediate frequency among the divided clock signals CKD1, CKD2 and CKD3 is being output as the receiving clock signal CK1 to the receiving circuit by the clock switching circuit 140, in the case that the clock signal CK1 supplied to the receiving circuit is detected to be slower than the received broadcast signal as a result of detection of the out-of-sync a switching control signal $S_C$ for switching to a faster clock signal, that is, the divided clock signal CKD1 is output. Conversely, when the clock signal CK1 supplied to the receiving circuit is faster than the received broadcast signal, a switching control signal $S_C$ for switching to a slower clock signal, that is, the divided clock signal CKD3 is output.

Next, the clock switching circuit 140 judges whether the count value CNT is zero or not (step S2).

When the count value CNT becomes zero, that is, the phases of the divided clock signals CKD1, CKD2 and CKD3 match, the clock switching is performed (step S3). At this time, the clock switching circuit 140 selects a divided clock signal designated by the switching control signal $S_C$ as the receiving clock signal CK1 and outputs the same at the timing that the count value CNT becomes zero.

The process of the steps S1 to S3 as described above are performed iteratively when the receiving circuit is operating, so that one of the three divided clock signals CKD1, CKD2 and CKD3 having different frequencies is selected in accordance with the out-of-sync between the receiving clock signal CK1 and the received broadcast signal and supplied to the receiving circuit as the receiving clock signal CK1, thus the out-of-sync between the receiving clock signal and the received broadcast signal can be compensated.

Below, a state transition of the receiving clock signal CK1 along with the clock switching will be explained with reference to waveforms shown in FIGS. 10A to 10G.

FIGS. 10A to 10G show the count value CNT of the counter 150 as well as waveforms of the clock signal CLK, the divided clock signals CKD1, CKD2 and CKD3 and the clock signal CK1 output by the switching circuit 140.

Figure 10:
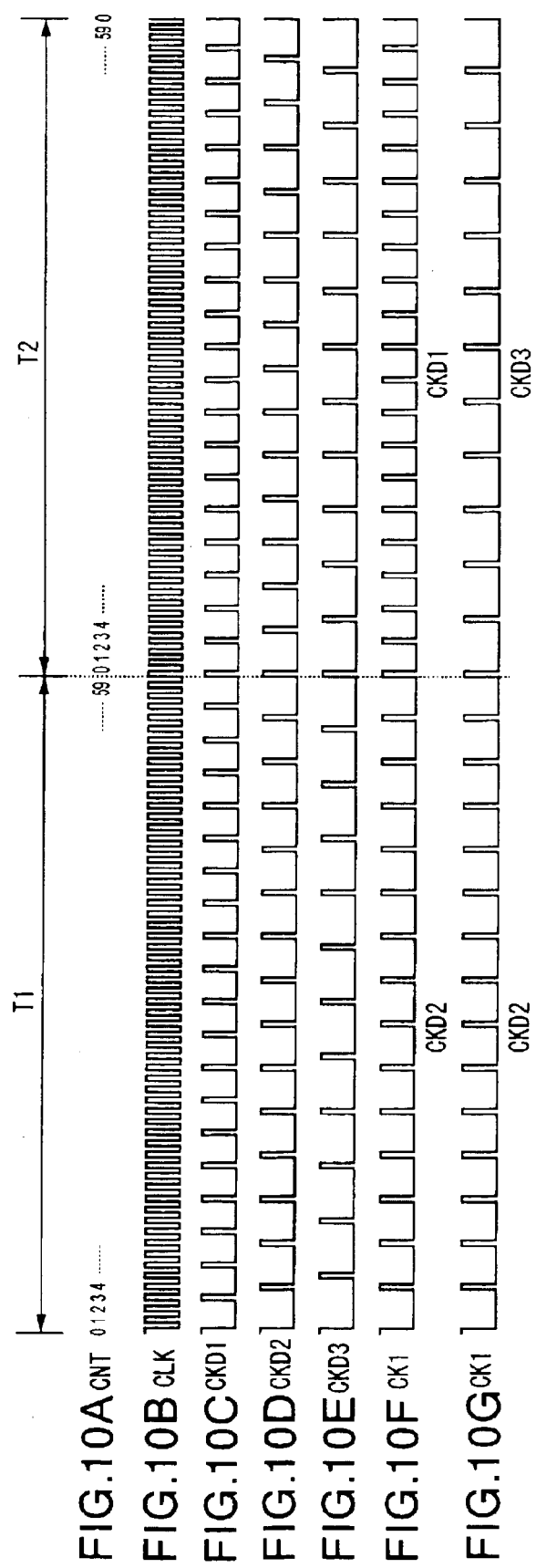
FIGS. 10A to 10G are waveform diagrams showing clock switching operation of the second embodiment.

FIG. 10A shows the count value CNT of the counter 150, FIG. 10B shows the waveform of the clock signal CLK, while FIGS. 10C to 10E show the waveforms of the divided clock signals CKD1, CKD2 and CKD3. Then FIGS. 10F and 10G show changes of the waveforms of the clock signal CK1 output by the clock switching.

As described above, the clock signals CKD1, CKD2 and CKD3 are divided clock signals obtained from the clock signal CLK by the division ratios n1=3, n2=4 and n3=5. That is, by assuming the initial value of the counter 150 as zero, the clock signal CKD1 is output when the count value CNT=0, 3, 6, . . . , the clock signal CKD2 is output when the count value CNT=0, 4, 8 . . . , and the clock signal CKD3 is output when the count value CNT=0, 5, 10 . . . . Since the least common multiple of the division ratios 3, 4 and 5 is 60, the phases of the divided clock signals CKD1, CKD2 and CKD3 coincide at each 60 cycles of the clock signal CLK.

That is, since the phases of the three clock signals CKD1, CKD2 and CKD3 coincide when the count value CNT is zero, by switching the clocks at this time, the breakdown of the timing can be prevented.

As described above, the clock switching circuit 140 of the present embodiment performs clock switching when the count value CNT is zero. For example, when the receiving clock signal CK1 is slower with respect to the broadcast signal, the receiving clock signal CK1 is switched to the faster clock signal CKD1 in accordance with the switching control signal $S_C$. As shown in FIGS. 10A and 10F, for example, when the count value CNT becomes zero, the clock signal CKD2 is switched to the clock CKD3.

That is, as shown in FIG. 10G, for example, in the period T1 the clock CKD2 is supplied to the receiving circuit as the output clock signal CK1, when a switching control signal $S_C$ requiring a faster clock is output in accordance with the detection result of the out-of-sync, the clock switching is performed at the timing when the count value CNT becomes zero so that the divided clock signal CKD1 will be selected as the output clock signal CK1 in the next period T2.

Conversely, as shown in FIG. 10G, in the period T1 the clock CKD2 is supplied to the receiving circuit as the output clock signal CK1, when a switching control signal $S_C$ requiring a slower clock is output in accordance with the detection result of the out-of-sync, the clock switching is performed at the timing when the count value CNT becomes zero so that the divided clock signal CKD3 will be selected as the output clock signal CK1 in the next period T2.

As same as what mention above, the switching from the clock CKD3 to the clock CKD2, also the switching from the clock CKD1 to the clock CKD2 are performed at the timings when the count value CNT becomes zero. Accordingly, the clock switching is always performed when the phases of the clock signals to be switched match, thus the breakdown of the timing due to the switching can be prevented.

Third Embodiment

Figure 11:
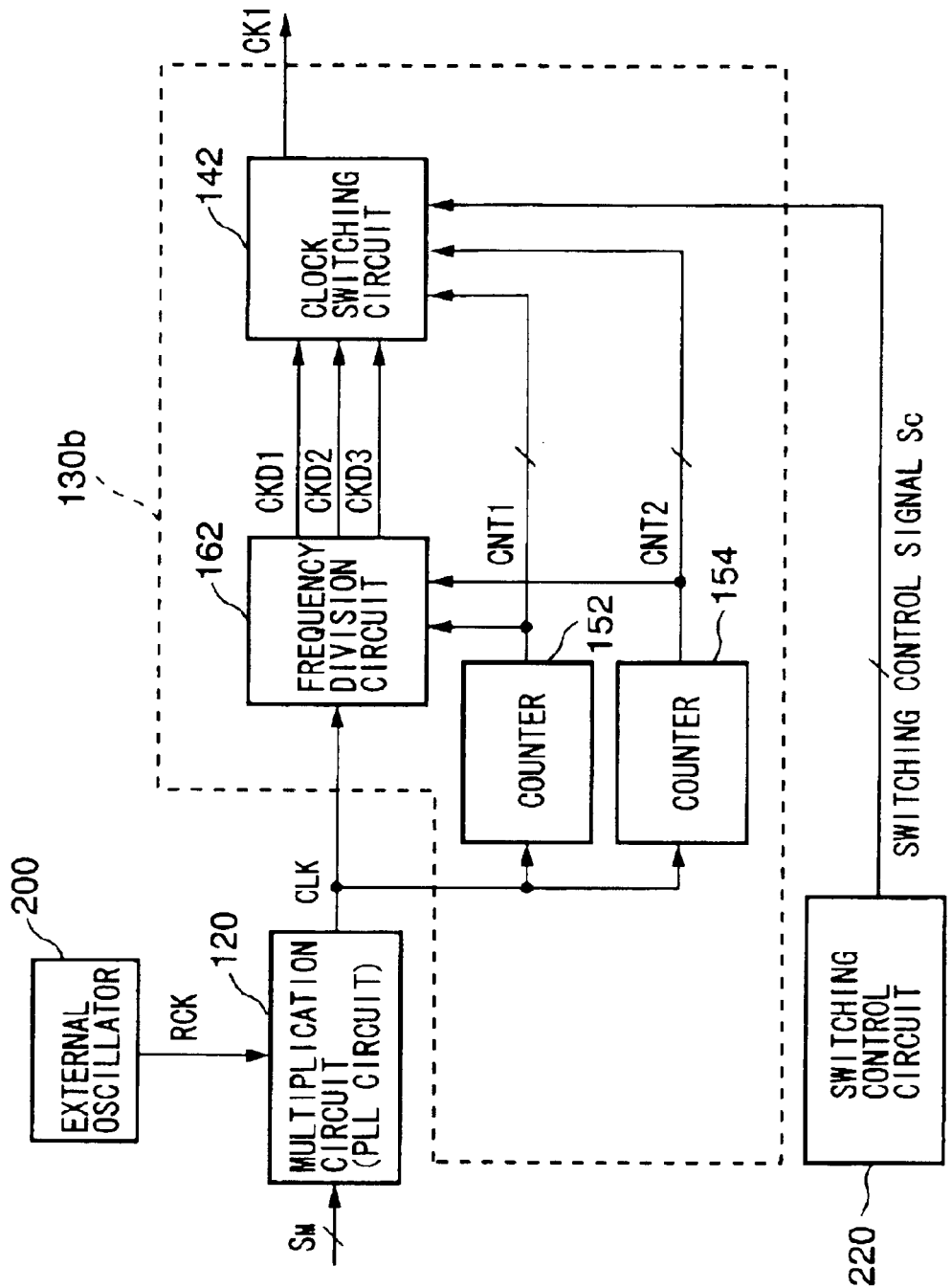
FIG. 11 is a circuit diagram of a third embodiment of a clock supply circuit according to the present invention, a diagram showing a configuration of a receiving clock generating circuit.

FIG. 11 is a circuit diagram showing a second embodiment of the clock supply signal according to the present invention, also a circuit diagram showing another example of a configuration of the receiving clock generating circuit supplying receiving clock signal to the receiving circuit.

As shown in the figure, in the present embodiment, the receiving clock generating circuit 130*b* is comprised of a clock switching circuit 142, counters 152 and 154, and a frequency division circuit 162.

In the second embodiment of the present invention described above, the clock switching circuit 140 performs clock switching in accordance with the count value of the sexagesimal counter 150. While in the receiving clock generating circuit 130*b* of the present embodiment, two counters 152 and 154 is provided, the switching of the clock signals CKD1 and CKD2 as well as the switching of the clock signals CKD3 and CKD2 are controlled in accordance with the count values of these counters.

In the clock supply circuit 130*b* of the present embodiment, the multiplication circuit 120 generates the multiplied clock signal CLK in accordance with the reference clock signal RCK supplied by the external oscillator 200, and supplies the same to the division circuit 162, the counter 152 and 154. The division circuit 162 divides the clock signal CLK by different division ratios to output the divided clock signals CKD1, CKD2 and CKD3, respectively.

Figure 12:
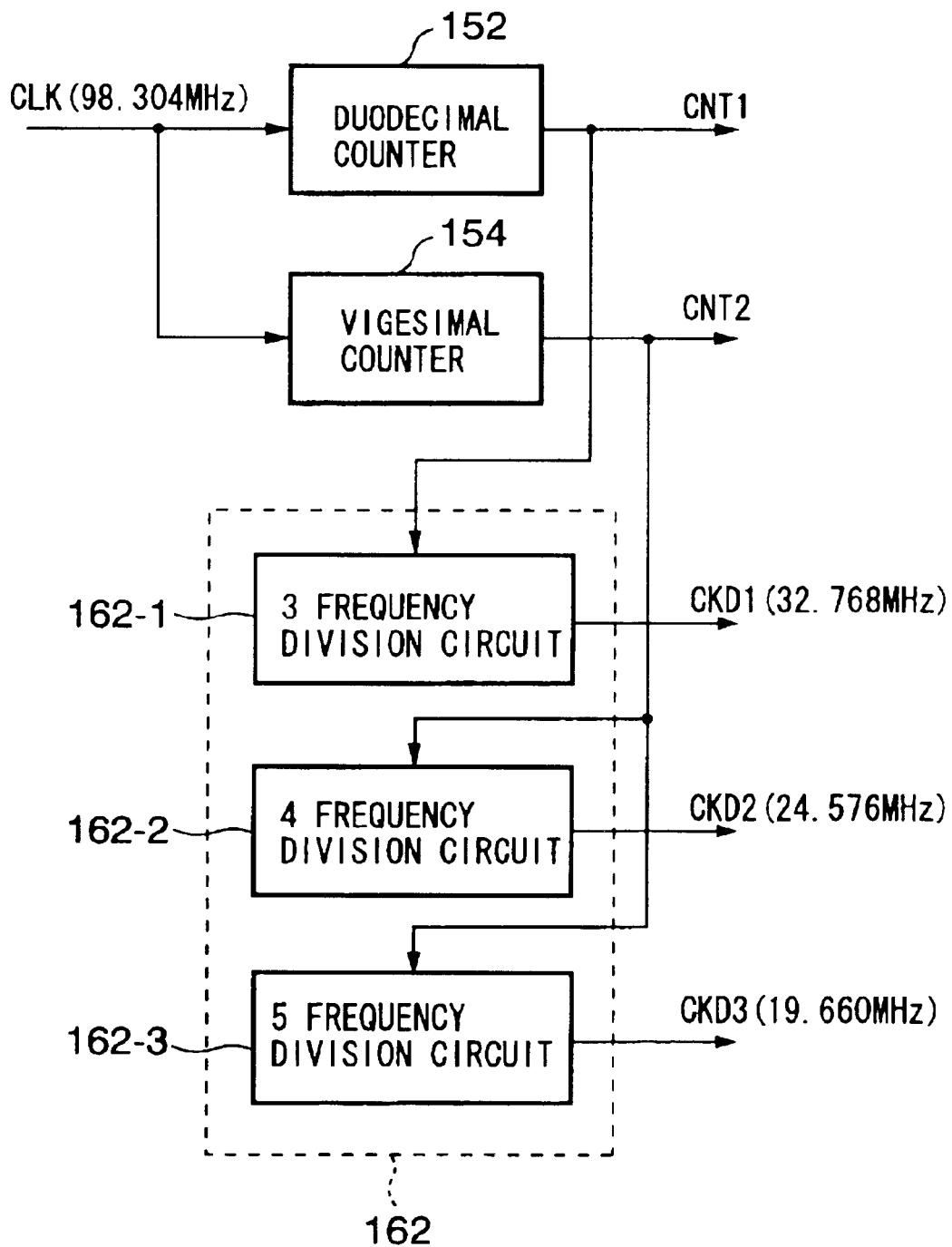
FIG. 12 is a view of a configuration of a frequency division circuit constituting the third embodiment.

FIG. 12 is a block diagram showing an example of a configuration of the division circuit 162 in accordance with the present embodiment.

In the present embodiment, for example, assuming that the division ratios for generating the divided clock signals CKD1, CKD2 and CKD3 are n1=3, n2=4, and n3=5, the least common multiple of n1 and n2 is 12, and the least common multiple of n2 and n3 is 20. Accordingly, the counter 152 is a duodecimal counter, while the counter 154 is a vigesimal one.

As illustrated, the division circuit 162 is comprised of a 3 division circuit 162-1, a 4 division circuit 162-2, and a 5 division circuit 162-3. These division circuits divide the input clock signal CLK by different division ratios to generate the divided clock signals CKD1, CKD2 and CKD3, respectively. Each division circuit comprising the division circuit 162 performs clock dividing in accordance with the count value CNT1 of the duodecimal counter 152 and the count value CNT2 of the vigesimal counter 154. For example, the 3 division circuit 162-1 outputs the clock signal CLK when the count value CNT1 becomes 0, 3, 6, . . . , the 4 division circuit 162-2 outputs the clock signal CLK when the count value CNT1 becomes 0, 4, 8, . . . , and the 5 division circuit 162-3 outputs the clock signal CLK when the count value CNT2 becomes 0, 5, 10, . . . . Accordingly, divided clock signals CKD1, CKD2 and CKD3 obtained by dividing the clock signal CLK with division ratios of 3, 4 and 5 are output from these division circuits.

Below, an explanation centered on the operation of the clock switching circuit 142 will be given.

The clock switching circuit 142 selects one of the three divided clock signals CKD1, CKD2 and CKD3 in accordance with the switching control signal $S_C$, performs clock switching at the timings set in accordance with the count values CNT1 of the counter 152 and CNT2 of the counter 154.

Figure 13:
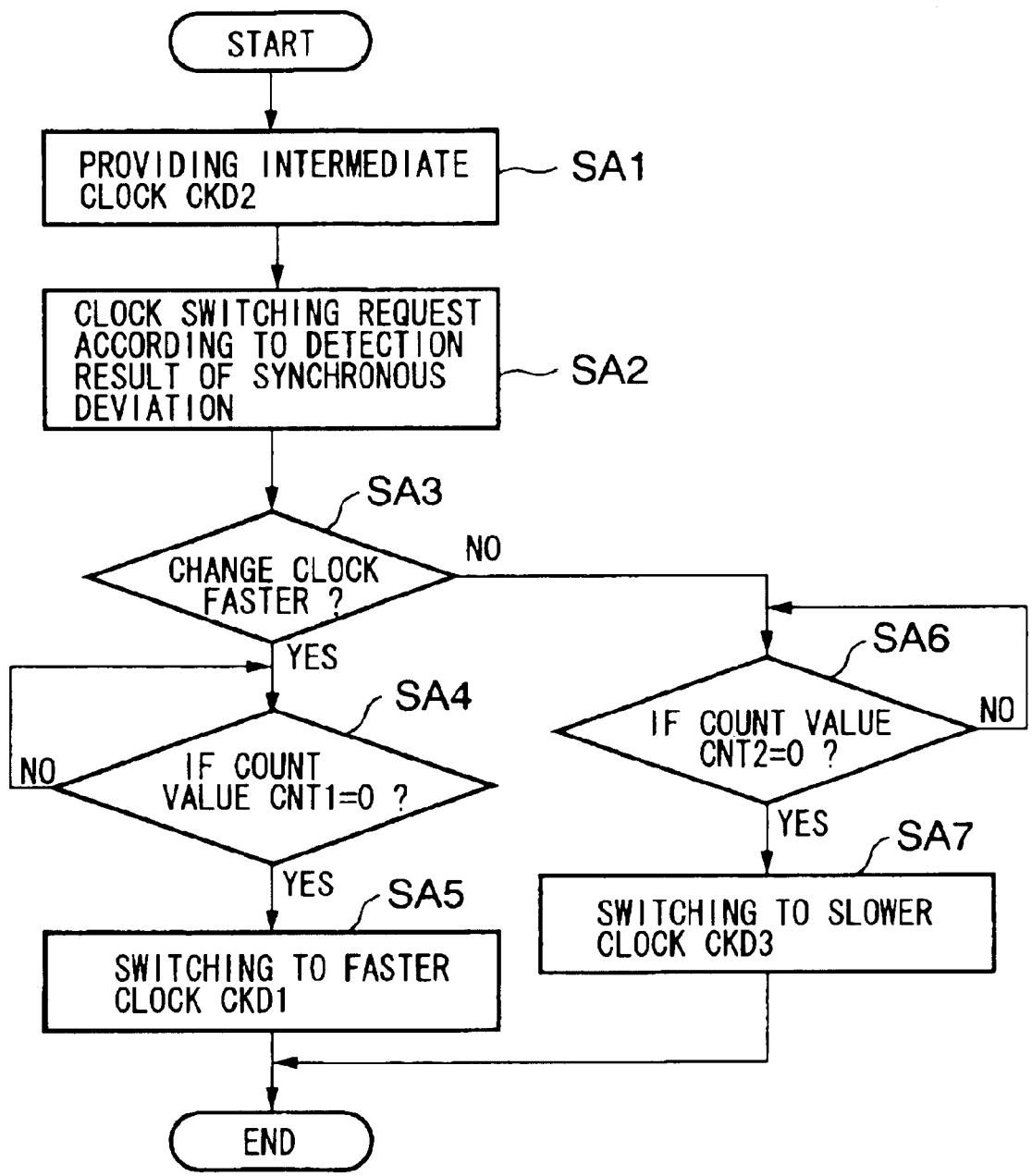
FIG. 13 is a flow chart showing clock switching operation of the third embodiment.
Figure 14:
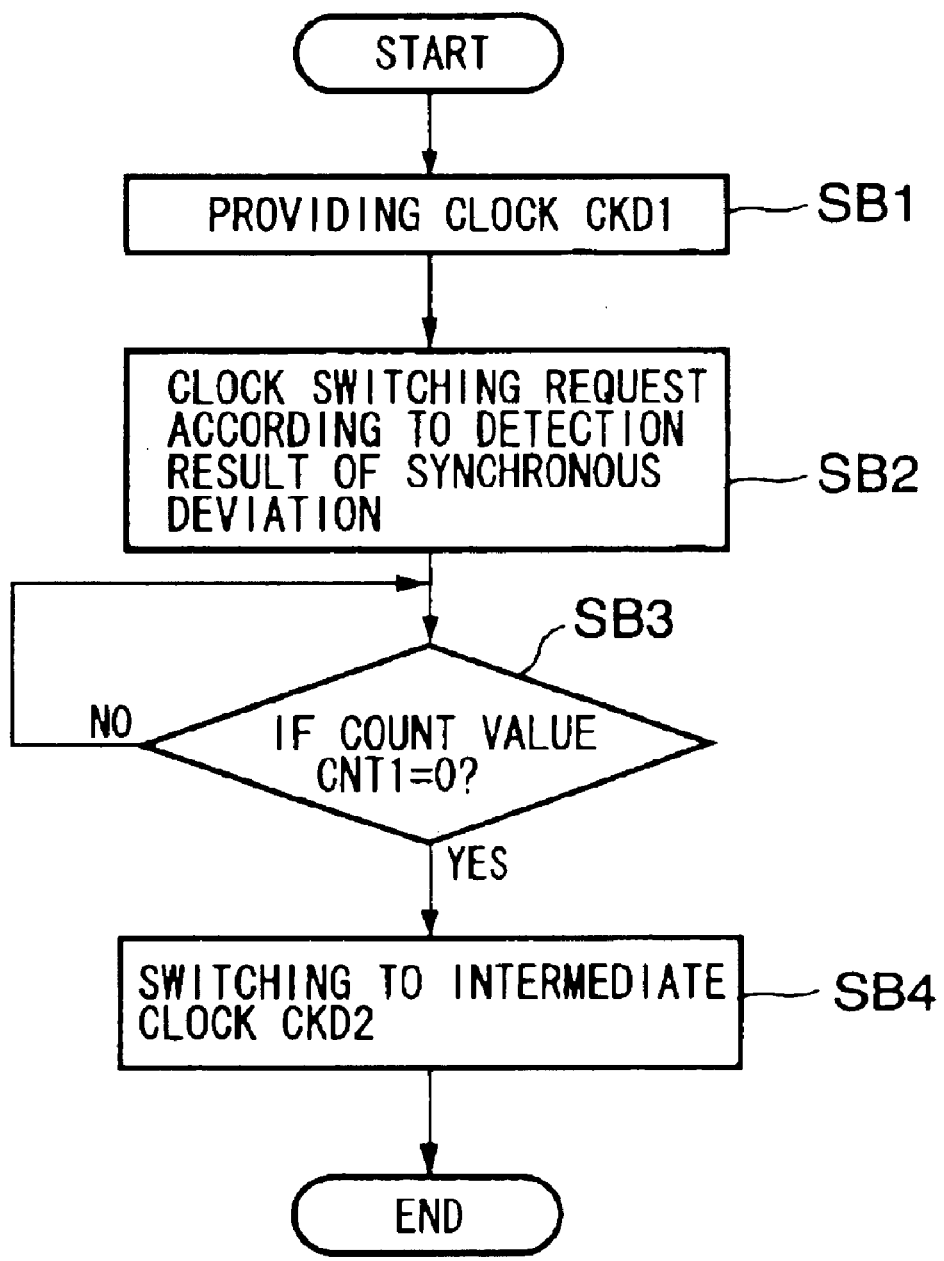
FIG. 14 is another flow chart showing clock switching operation of the third embodiment.
Figure 15:
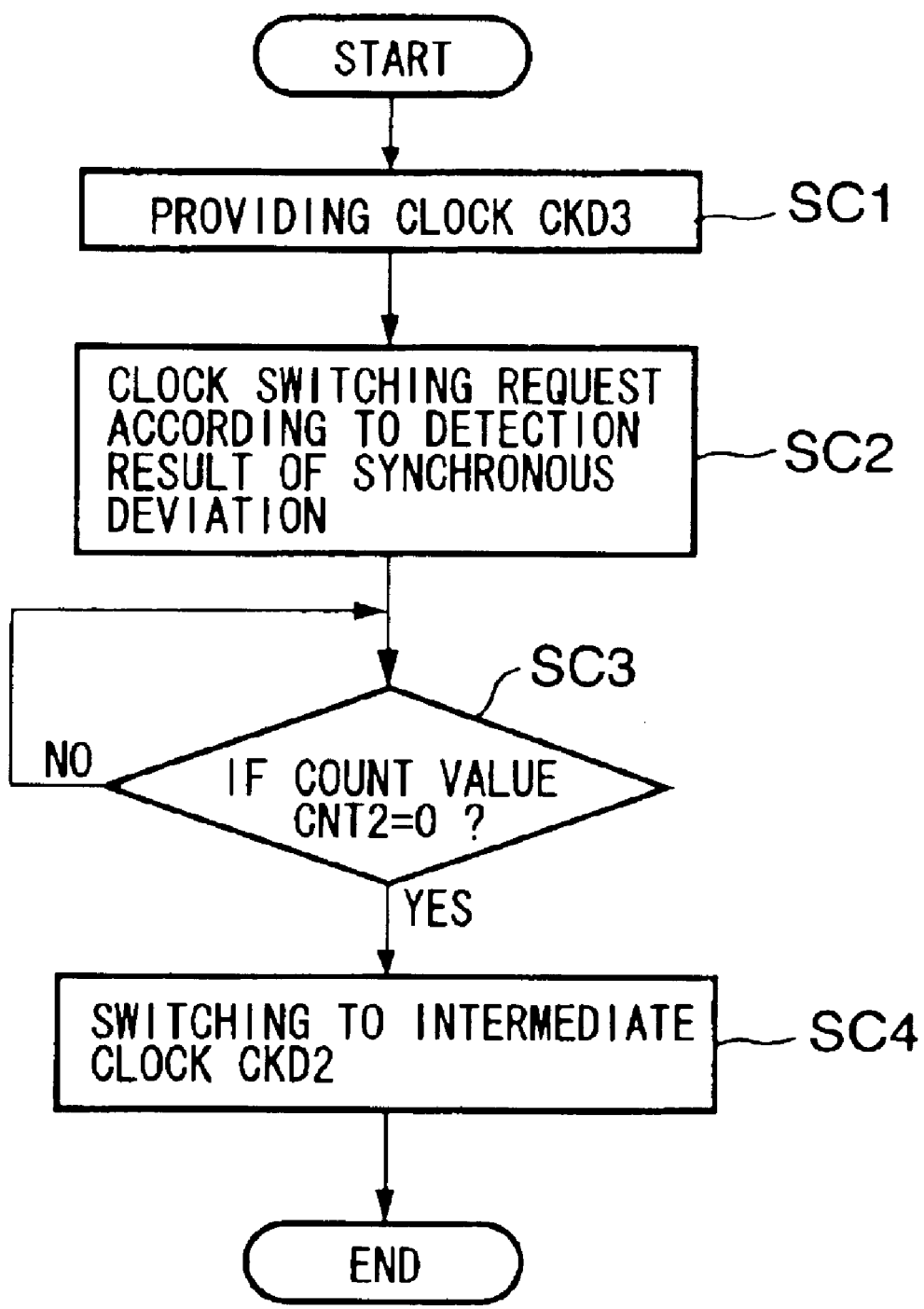
FIG. 15 is another flow chart showing clock switching operation of the third embodiment.

FIGS. 13 to 15 are flow charts showing switching controls of the clock switching circuit 142. Below, the operation of the clock switching circuit 142 will be explained with reference to FIGS. 13 to 15.

FIG. 13 is a flow chart showing a clock switching process when outputting the clock signal CKD2 having a intermediate frequency among the divided clock signals CKD1, CKD2 and CKD3 as the receiving clock signal CK1 to the receiving circuit. FIG. 14 is a flow chart showing a clock switching process when outputting the clock signal CKD1 having a frequency higher than the intermediate frequency of the clock signal CKD2 as the receiving clock signal CK1 to the receiving circuit. Further, FIG. 15 is a flow chart showing a clock switching process when outputting the clock signal CKD3 having a frequency lower than the intermediate frequency of the clock signal CKD2 as the receiving clock signal CK1 to the receiving circuit.

First, the clock switching process when outputting the clock signal CKD2 will be explained with reference to FIG. 13.

When outputting the clock signal CKD2 having the intermediate frequency as the receiving clock signal CK1 to the receiving circuit, it is detected whether the receiving clock signal is slower of faster with respect to a received broadcast signal in accordance with the detection result of the out-of-sync. According to this detection result, a switching control signal $S_C$ for switching to the faster clock signal CKD1 or to the slower clock signal CKD3 is output. Then the clock switching circuit 142 selects the clock signal designated by the switching control signal $S_C$ and performs clock switching at the timings set by the count values CNT1 or CNT2.

First, in the step SA1, the clock signal CKD2 of the intermediate frequency is supplied to the receiving circuit as the receiving clock signal.

Next, in the step SA2, a clock switching request is output in accordance with the detection result of the out-of-sync.

Then, whether the receiving clock signal CK1 is slower or faster than the received broadcast signal is judged (step SA3). According to the judgment result, the clock switching is performed.

For example, when the receiving clock signal is slower than the received broadcast signal in accordance with the detection result of the out-of-sync, the switching control signal $S_C$ for selecting the clock signal CKD1 faster than the clock signal CKD2 of the intermediate frequency is output.

At this time, the clock switching circuit 142 performs the clock switching at the timings set in accordance with the count value CNT1. As illustrated, the clock switching circuit 142 judges whether the count value CNT1 is 0 or not (step SA4), when the count value CNT1 becomes 0, selects the faster clock signal CKD1 and outputs the same as the receiving clock signal CK1 (step SA5)

On the other hand, when the receiving clock signal is faster than the received broadcast signal in accordance with the detection result of the out-of-sync, the switching control signal $S_C$ for selecting the clock signal CKD3 slower than the clock signal CKD2 of the intermediate frequency is output.

At this time, the clock switching circuit 142 performs the clock switching at the timings set in accordance with the count value CNT2. As illustrated, the clock switching circuit 142 judges whether the count value CNT2 is 0 or not (step SA6), when the count value CNT2 becomes 0, selects the slower clock signal CKD3 and outputs the same as the receiving clock signal CK1 (step SA7).

Next, the operation of the clock switching when outputting the clock signal CKD1 of a higher frequency will be explained with reference to FIG. 14.

First, the clock signal CKD1 is output to the receiving circuit as the receiving clock signal CK1 (step SB1).

Then, a clock switching request is output in accordance with the detection result of the out-of-sync (step SB2). The clock signal CKD1 is higher in frequency in comparison with the clock signal CKD2 of the intermediate frequency. Therefore, when continuously receiving the broadcast signals using the clock signal CKD1 as the receiving signal CK1, the receiving clock signal gets faster in phase than the broadcast signals, so that an out-of-sync will arise. At this time, a process that returning to the clock signal CKD2 of the intermediate frequency is performed.

When receiving the clock switching request, the clock switching circuit 142 switches from the clock signal CKD1 to the clock signal CKD2 of the intermediate frequency at the timings set in accordance with the count value CNT1.

As shown in FIG. 14, the clock switching circuit 142 judges whether the count value CNT1 is zero or not (step SB3). When the count value CNT1 becomes zero, the clock switching circuit 142 switches from the clock signal CKD1 to the clock signal CKD2 of the intermediate frequency, outputs the same to the receiving circuit as the receiving clock signal CK1 (step SB4).

Next, the operation of the clock switching when outputting the clock signal CKD3 of a lower frequency will be explained with reference to FIG. 15.

First, the clock signal CKD3 is output to the receiving circuit as the receiving clock signal CK1 (step SC1).

Then, a clock switching request is output in accordance with the detection result of the out-of-sync (step SC2). The clock signal CKD3 is lower in frequency in comparison with the clock signal CKD2 of the intermediate frequency. Therefore, when continuously receiving the broadcast signals using the clock signal CKD3 as the receiving signal CK1, the receiving clock signal gets slower in phase than the broadcast signals, so that an out-of-sync will arise. At this time, a process that returning to the clock signal CKD2 of the intermediate frequency is performed.

When receiving the clock switching request, the clock switching circuit 142 switches from the clock signal CKD3 to the clock signal CKD2 of the intermediate frequency at the timings set in accordance with the count value CNT2.

As shown in FIG. 15, the clock switching circuit 142 judges whether the count value CNT2 is zero or not (step SC3). When the count value CNT2 becomes zero, the clock switching circuit 142 switches from the clock signal CKD3 to the clock signal CKD2 of the intermediate frequency, outputs the same to the receiving circuit as the receiving clock signal CK1 (step SC4).

FIGS. 16A to 16G are waveform diagrams showing the clock switching timings of the present embodiment. Below, the operation of the clock switching of the present embodiment will be explained with reference to FIGS. 16A to 16G.

Figure 16:
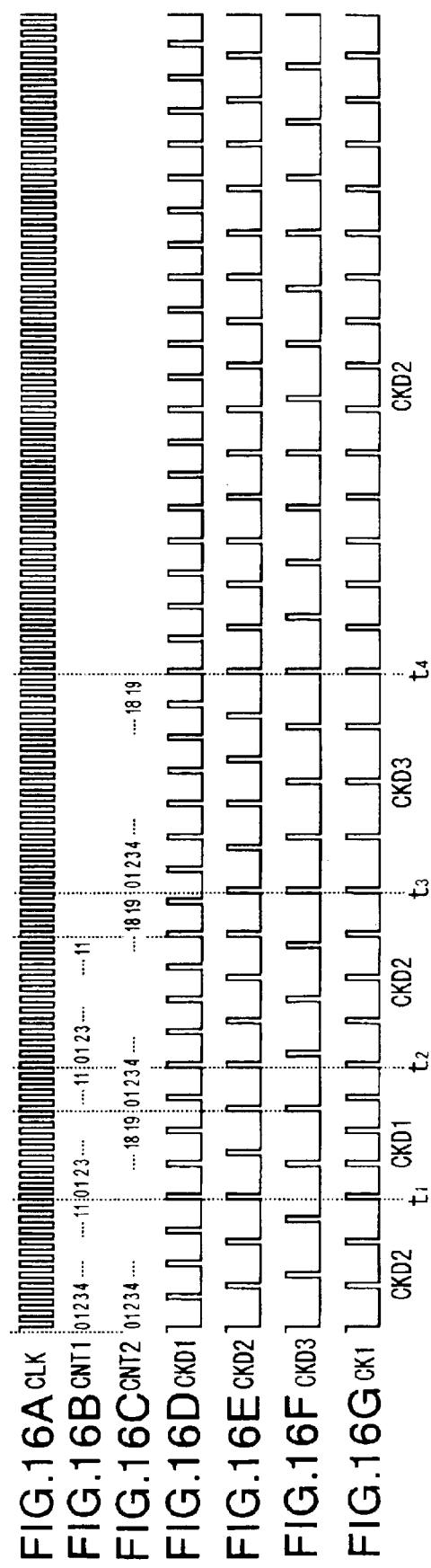
FIGS. 16A to 16G are waveform diagrams showing clock switching operation of the third embodiment.

FIG. 16A shows the waveform of the clock signal CLK, FIGS. 16B and 16C show the count values CNT1 and CNT2, respectively. Further, FIGS. 16D to 16F show the waveforms of the divided clock signals CKD1, CKD2 and CKD3, respectively, while FIG. 16G shows the waveform of the receiving clock signal CK1 output by the clock switching circuit 142.

The clock switching circuit 142 of the present embodiment performs the clock switching when the phases of the clock signals to be switched match. That is, for example, when the phases of the clock signals CKD1 and CKD2 match, the clock switching from the clock signal CKD2 to CKD1, or from the clock signal CKD1 to CKD2 is performed. Similarly, when the phases of the clock signals CKD2 and CKD3 match, the clock switching from the clock signal CKD2 to CKD3, or from the clock signal CKD3 to CKD2 is performed.

The judgment of whether the phases of the clock signals CKD1 and CKD2 match is performed in accordance with the count value CNT1 of the counter 152. Similarly, the judgment of whether the phases of the clock signals CKD2 and CKD3 match is performed in accordance with the count value CNT2 of the counter 154.

As described above, the division ratios for generating the clock signals CKD1 and CKD2 are 3 and 4, thus as shown in FIGS. 16B, 16D and 16E, when the count value CNT1 becomes 0, that is, at each 12 cycles of the clock signal CLK, the phases of the clock signals CKD1 and CKD2 match. In this way, the count value CNT1 of the duodecimal counter 152 becomes zero, the phases of the clock signals CKD1 and CKD2 match. Similarly, the division ratios for generating the clock signals CKD2 and CKD3 are 4 and 5, thus as shown in FIGS. 16C, 16E and 16F, when the count value CNT2 becomes 0, that is, at each 20 cycles of the clock signal CLK, the phases of the clock signals CKD2 and CKD3 match. In this way, the count value CNT2 of the vigesimal counter 154 becomes zero, the phases of the clock signals CKD2 and CKD3 match.

According to this, the clock switching circuit 142 of the present embodiment performs switching of the clocks CKD1 and CKD2 when the count value CNT1 of the counter 152 becomes 0. Similarly, it performs switching of the clocks CKD2 and CKD3 when the count value CNT2 of the counter 154 becomes 0.

FIG. 16G shows an example of the clock signal CK1 output from the clock switching circuit 142. As illustrated, first, the clock switching circuit 142 selects and outputs the clock signal CKD2 to the receiving circuit. Then switches to the clock signal CKD1 in accordance with the switching control signal $S_C$. At this time, the clock switching circuit 142 controls the switching timing in accordance with the count value CNT1 of the counter 152. At a time t1, the count value CNT1 of the counter 152 becomes 0. That is, the phases of the clock signals CKD1 and CKD2 match right at this time, thus the switching from the clock signal CKD2 to CKD1 is performed.

Next, the clock switching from the clock signal CKD1 to CKD2 is performed in accordance with the switching control signal $S_C$. At this time, the clock switching circuit 142 controls the switching timing in accordance with the count value CNT1 of the counter 152. At a time t2, the count value CNT1 of the counter 152 becomes 0. That is, the phases of the clock signals CKD1 and CKD2 match right at this time, thus the switching from the clock signal CKD1 to CKD2 is performed.

Next, the clock switching from the clock signal CKD2 to CKD3 is performed in accordance with the switching control signal $S_C$. Therefore, the clock switching circuit 142 controls the switching timing in accordance with the count value CNT2 of the counter 154.

As illustrated, at a time t3, the count value CNT2 of the counter 154 becomes 0, therefore the phases of the clock signals CKD2 and CKD3 match at this time, thus the switching from the clock signal CKD2 to CKD3 is performed.

Then, the clock switching from the clock signal CKD3 to CKD2 is performed in accordance with the switching control signal $S_C$. Therefore, the clock switching circuit 142 controls the switching timing in accordance with the count value CNT2 of the counter 154. At a time t4, the count value CNT2 of the counter 154 becomes 0, therefore the phases of the clock signals CKD2 and CKD3 match at this time, thus the switching from the clock signal CKD3 to CKD2 is performed.

As described above, in the present embodiment, two counters 152 and 154 are provided. The clock switching circuit 142 controls the switching timing of the clock signals CKD1 and CKD2 in accordance with the count value CNT1 of the counter 152, also controls the switching timing of the clock signals CKD2 and CKD3 in accordance with the count value CNT2 of the counter 154. Therefore, clock switching from the clock signals CKD1 to CKD2, or from the clock signals CKD2 to CKD1 is performed when the phases of the clock signals CKD1 and CKD2 match. Similarly, clock switching from the clock signals CKD2 to CKD3, or from the clock signals CKD3 to CKD2 is performed when the phases of the clock signals CKD2 and CKD3 match. As a result, in comparison with the first embodiment, in the present embodiment, the clock switching can be done at small intervals, by switching the clock signals appropriately in accordance with the out-of-sync with respect to the broadcast signals, the out-of-sync can be compensated at any time, and the received signals can be retrieved at a high accuracy.

Fourth Embodiment

Figure 17:
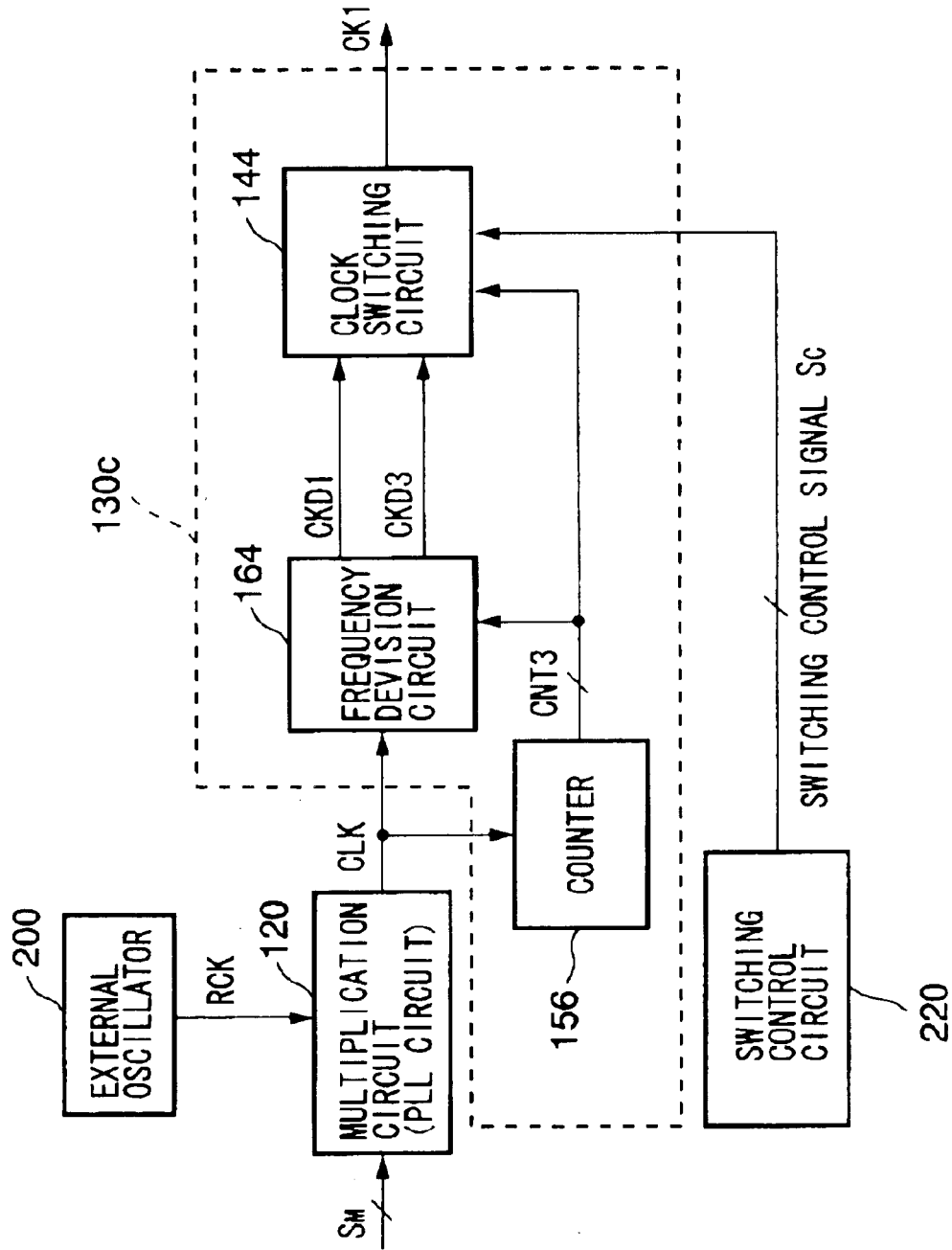
FIG. 17 is a circuit diagram of a fourth embodiment of a clock supply circuit according to the present invention, a diagram showing a configuration of a receiving clock generating circuit.

FIG. 17 is a circuit diagram showing a fourth embodiment of the clock supply circuit according to the present invention, also a circuit diagram showing another example of a configuration of the receiving clock generating circuit supplying receiving clock signal to the receiving circuit.

As shown in the figure, in the present embodiment, the receiving clock generating circuit 130c is comprised of a clock switching circuit 144, a counter 156, and a frequency division circuit 164.

In the receiving clock generating circuit 130c of the present embodiment, the division circuit 164 divides the clock signal CLK by predetermined division ratios to output the divided clock signals CKD1 and CKD3, respectively. Note that, differs from the first and the second embodiments described above, in the present embodiment, the divided clock signal CKD2 having the intermediate frequency is not generated, while the divided clock signal CKD1 which is faster than the clock signal CKD2 and the divided clock signal CKD3 which is slower than the clock signal CKD2 are supplied to the clock switching circuit 144. That is, the receiving clock generating circuit 130c in the present embodiment generates clock signals having frequencies slightly higher and lower than the received broadcast signals. The clock switching circuit 144 selects and outputs the clock signals CKD1 and CKD3 to maintain synchronization with the broadcast signals.

The division circuit 164 divides the clock signal CLK supplied by the multiplication circuit 120 by frequency division ratios 3 and 5 to output the divided clock signals CKD1 and CKD3. Here, for example, assuming the frequency of the clock signal CLK is 98.304 MHZ, the frequencies of the clock signals CKD1 and CKD3 are 32.768 MHZ and 19.660 MHZ, respectively.

Figure 18:
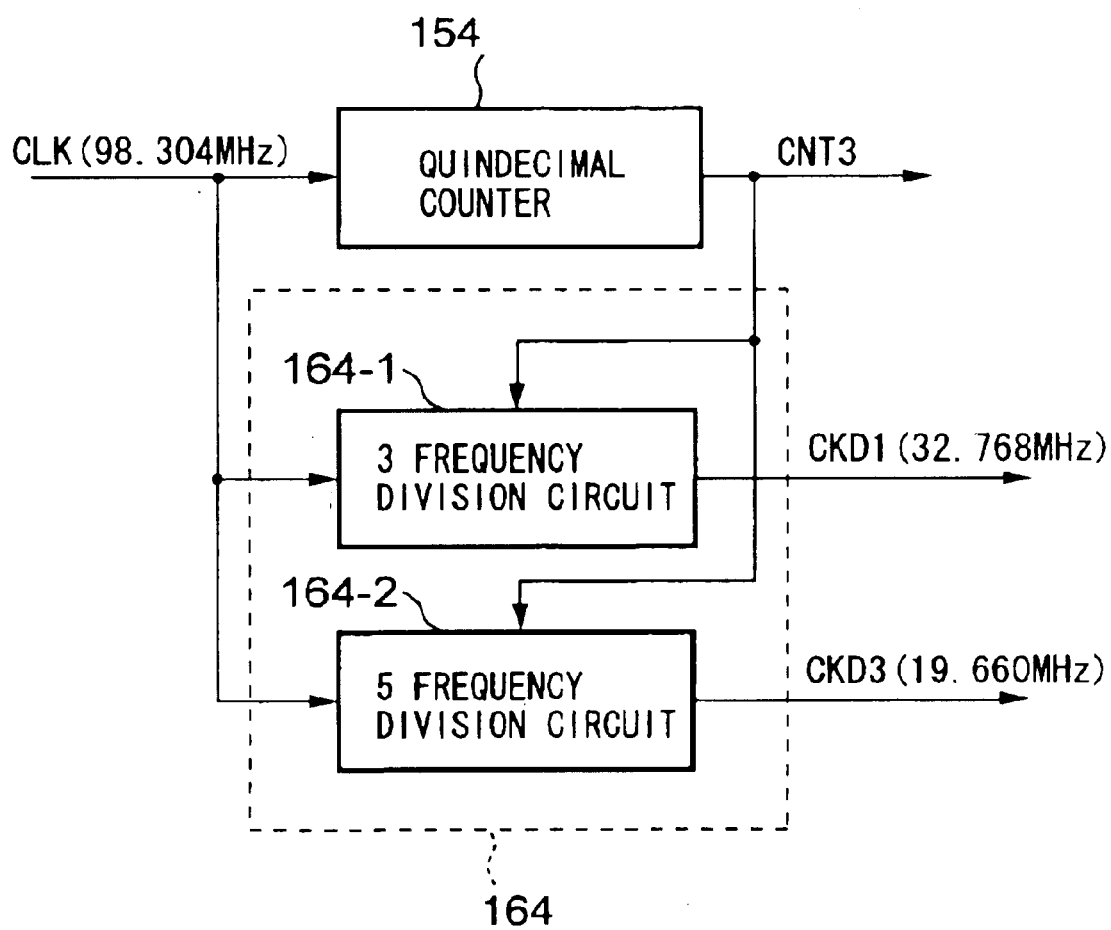
FIG. 18 is a view of a configuration of a frequency division circuit constituting the fourth embodiment.

FIG. 18 is a block diagram showing an example of a configuration of the division circuit 164 in accordance with the present embodiment.

In the present embodiment, for example, the division ratios for generating the divided clock signals CKD1 and CKD3 are 3 and 5, respectively. Since the least common multiple of the division ratios 3 and 5 is 15, the counter 156 is a quindecimal counter. Therefore, when the count value CNT3 of the counter 156 becomes 0, the phases of the clock signals CKD1 and CKD3 match. The clock switching circuit 144 controls the switching timing in accordance with the count value CNT3 of the counter 156. That is, performs clock switching when the count value CNT3 becomes 0.

As illustrated, the division circuit 164 is comprised of a 3 division circuit 164-1, and a 5 division circuit 164-2. These division circuits divide the input clock signal CLK by different division ratios to generate the divided clock signals CKD1 and CKD3, respectively. Each division circuit comprising the division circuit 164 performs clock dividing in accordance with the count value CNT3 of the quindecimal counter 156. For example, the 3 division circuit 164-1 outputs the clock signal CLK when the count value CNT3 becomes 0, 3, 6, . . . , and the 5 division circuit 164-2 outputs the clock signal CLK when the count value CNT3 becomes 0, 5, 10, . . . . According to this, divided clock signals CKD1 and CKD3 obtained by dividing the clock signal CLK with division ratios of 3 and 5 are output from these division circuits.

Figure 19:
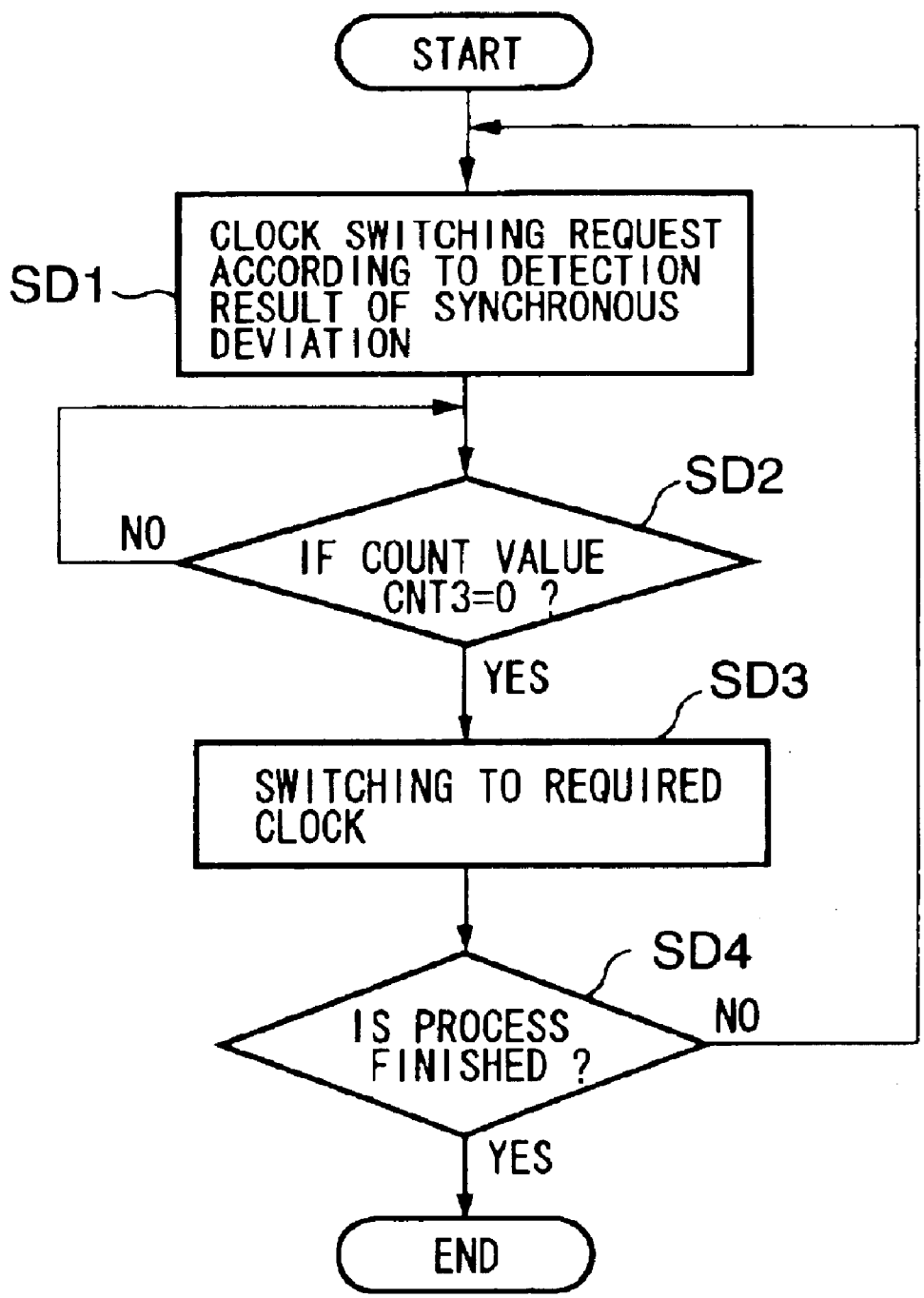
FIG. 19 is a flow chart showing clock switching operation of the fourth embodiment.

FIG. 19 is a flow charts show switching control of the clock switching circuit 144. Below, the operation of the clock switching circuit 144 will be explained with reference to FIG. 19.

First, in the step SD1, a clock switching request is output by, for example, the switching circuit 220 in accordance with the detection result of the out-of-sync. According to the detection result, when the clock signal CK1 supplied to the receiving circuit is slower than the received broadcast signal, a switching control signal $S_C$ for switching to a faster clock signal, that is, the clock signal CKD1 is output. On the other hand, when the clock signal CK1 supplied to the receiving circuit is faster than the received broadcast signal, a switching control signal $S_C$ for switching to a slower clock signal, that is, the clock signal CKD3 is output.

Next, the clock switching circuit 144 judges whether the count value CNT3 is 0 or not (step SD2).

When the count value CNT3 becomes 0, that is, the phases of the divided clock signals CKD1 and CKD3 match, the clock switching is performed (step SD3). At this time, the clock switching circuit 144 selects a divided clock signal designated by the switching control signal $S_C$ as the receiving clock signal CK1, outputs the same at the timing when the count value CNT3 becomes 0.

The process of the steps SD1 to SD3 as described above are performed iteratively when the receiving circuit is operating, so that one of the divided clock signals CKD1 and CKD3 having different frequencies is selected in accordance with the out-of-sync between the receiving clock signal CK1 and the received broadcast signal and supplied to the receiving circuit as the receiving clock signal CK1, thus the out-of-sync between the receiving clock signal and the received broadcast signal can be compensated.

FIGS. 20A to 20E are waveforms showing the operation of the clock supply circuit of the present embodiment. FIG. 20A shows the waveform of the clock signal CLK, FIG. 20B shows the count values CNT3 of the counter 156. FIGS. 20C and 20D show the waveforms of the divided clock signals CKD1 and CKD3, while FIG. 20E shows the waveform of the clock signal CK1 output by the clock switching circuit 144.

Next, an explanation of the operation of the clock switching circuit 144 of the present embodiment will be given with reference to FIGS. 20A to 20E.

As shown in FIG. 20E, first, for example, the clock signal CKD1 is selected and output as the clock signal CK1 by the clock switching circuit 144.

Next, the clock signal CKD3 is selected in accordance with the switching control signal $S_C$ by the clock switching circuit 144. Then the clock switching timing is controlled according to the count value CNT3 of the counter 156.

As shown in FIGS. 20B, 20C and 20D, the phases of the clock signals CKD1 and CKD3 match when the count value CNT3 of the counter 156 becomes 0. Therefore, the clock switching circuit 144 switches from the clock signal CKD1 to CKD3 at the time t1 when the count value CNT3 becomes 0.

Next, the clock switching circuit 144 switches from the clock signal CKD3 to CKD1 in accordance with the switching control signal $S_C$. Similar to the switching as described above, the clock switching circuit 144 performs clock switching at the timing when the count value CNT3 becomes 0. That is, as shown in FIGS. 20B and 20E, at the time t2, the count value CNT3 becomes 0, accordingly, the clock switching circuit 144 switches from the clock signal CKD3 to CKD1.

As described above, in the clock supply circuit of the present embodiment, the clock switching circuit selects the clock signal CKD1 having a frequency slightly higher than that of the broadcast signal or the clock signal CKD3 having a frequency slightly lower than that of the broadcast signal, supplies the selected one to the receiving circuit. The clock switching is performed in accordance with the count value CNT3 of the counter 156 so that it is possible to switch the clock signals CKD1 and CKD3 when the phases thereof match.

The embodiments of the clock generating circuit supplying the receiving clock signal CK1 to the receiving circuit according to the clock supply circuit of the present invention are explained above. The clock supply circuit of the present invention is comprised of the DSP clock generating circuit explained in the first embodiment and the receiving clock signal generating circuit explained in the second to fourth embodiments, therefore, it is possible to supply a clock signal having a frequency controlled in accordance with the processing load of the signal processing circuit, for example, the DSP block. Also, since one of a plurality of clock signals is selected and supplied in accordance with the out-of-sync with respect to the received broadcast signals received by the receiving circuit, the out-of-sync with respect to the received broadcast signals can be compensated.

As explained above, according to the clock supply circuit of the present invention, by just using a low frequency oscillator provided outside, a high frequency multiplied clock can be generated by a multiplication circuit comprised of a PLL circuit, a clock signal having a constant frequency can be supplied to receiving circuits such as an FFT block and Viterbi block, and furthermore, by switching clock signals having slightly different frequencies in accordance with the out-of-sync between the received broadcast signal and the receiving clock signal, then supplying the same to the receiving circuit, the out-of-sync can be compensated, and the received signals can be retrieved with a high accuracy.

Further more, according to the clock supply circuit lags of the present invention, a clock signal capable of being controlled in its frequency in accordance with a processing load can be supplied to a DSP circuit for expansion of an MPEG stream etc. As a result, by operating the DSP at a high speed at the time of a high load and operating the DSP at a low operation speed in accordance with the load at the time of a low load, a reduction of the power consumption can be realized.

Furthermore, according to the present invention, there are advantages that the configuration of the clock supply circuit can be simplified and reduction of a circuit scale and power consumption can be realized.

Note that the present invention is not limited to the above embodiments and includes modifications within the scope of the claims.

What is claimed is:

1. A clock supply circuit supplying a processing clock signal for processing an input signal having a predetermined frequency, said clock supply circuit comprising:
   a clock generating means generating a intermediate clock signal for processing said input signal, a first clock signal higher in frequency than the intermediate clock signal, and a second clock signal lower in frequency than the intermediate clock signal,
   a clock switching means selecting any of the intermediate clock signal, the first clock signal or the second clock signal, supplying the selected one as said processing clock signal to the signal processing, and
   a clock switching control means for processing said input signal with use of the selected processing clock signal, detecting an amount out-of-sync of the processing clock signal with respect to the input signal in accordance with the processing result, and controlling the clock switching in accordance with said detected amount out-of-sync,
   wherein said clock generating means further comprises:
   an oscillation means generating a reference clock signal having a predetermined reference frequency,
   a multiplying means generating a multiplied clock signal obtained by multiplying said reference clock signal, and
   a frequency division means for dividing said multiplied clock signal by different frequency division ratios to generate said intermediate clock signal, said first clock signal and said second clock signal, respectively, and
   wherein the clock switching means switches said clock signals using a predetermined time span as a switching time unit wherein at the start and ending time phases of said intermediate clock signal, said first and second clock signals match.

2. A clock supply circuit as set forth in claim 1, further comprises a counter for counting said multiplied clock signal, having a maximum count value set in accordance with a least common multiple of an intermediate division ration for generating said intermediate clock signal, a first division ratio for generating said first clock signal and a second division ratio for generating said second clock signal, wherein
   said clock switching means performs clock switching when the count value of said counter reaches a predetermined value.

3. A clock supply circuit as set forth in claim 2, wherein said predetermined value is zero or said maximum count value.

4. A clock supply circuit as set forth in claim 1, wherein said clock switching means switches said intermediate clock signal and said first clock signal using a predetermined time span as a first time switching unit wherein the start and ending time phases of said intermediate clock signal and said first clock signal match, and
   switches intermediate clock signal and said second clock signal using a predetermined time span as a second time switching unit wherein the start and ending time phases of said intermediate clock signal and said second clock signal match.

5. A clock supply circuit as set forth in claim 4, further comprises
   a first counter counting said multiplied clock signal, having a first maximum count value set in accordance with a least common multiple of an intermediate division ratio for generating said intermediate clock signal and a first division ratio for generating said first clock signal, and
   a second counter counting said multiplied clock signal, having a second maximum count value set in accordance with a least common multiple of a intermediate division ration for generating said intermediate clock signal and a second division ratio for generating said second clock signal, wherein
   said clock switching means further comprises
   a first switching circuit performing clock switching of the intermediate clock signal and the first clock signal when the count value of said first counter reaches a first value, and
   a second switching circuit performing clock switching of the intermediate clock signal and the second clock signal when the count value of said second counter reaches a second value.

6. A clock supply circuit as set forth in claim 5 wherein said first value is zero or said first maximum value, and said second value is zero or said second maximum value.

7. A clock supply circuit supplying a processing clock signal for processing an input signal having a predetermined frequency, said clock supply circuit comprising:

a clock generating means generating a first clock signal and a second clock signal having a lower frequency than that of said first clock signal, a clock switching means selecting any of the first clock signal or the second clock signal, supplying the selected one as said processing clock signal to the signal processing, and a clock switching control means for processing said input signal with use of the selected processing clock signal, detecting an amount out-of-sync of the processing clock signal with respect to the input signal in accordance with the processing result, and controlling the clock switching in accordance with said detected amount out-of-sync, wherein said clock generating means further comprises:

an oscillation means generating a reference clock signal having a predetermined reference frequency, a multiplying means generating a multiplied clock signal obtained by multiplying said reference clock signal, and a frequency division means for dividing said multiplied clock signal by different frequency division ratios to generate said first clock signal and said second clock signal, respectively, and wherein the clock switching means switches said clock signals using a predetermined time span as a switching time unit wherein the start and ending time phases of said first and second clock signals match.

8. A clock supply circuit as set forth in claim 7, further comprises a counter for counting said multiplied clock signal, having a maximum count value set in accordance with a least common multiple of a first division ratio for generating said first clock signal and a second division ratio for generating said second clock signal, wherein said clock switching means performs clock switching when the count value of said counter reaches a predetermined value.

9. A clock supply circuit as set forth in claim 8, wherein said predetermined value is zero or said maximum count value.

* * * * *